United States Patent
Babbitt et al.

(10) Patent No.: US 7,471,224 B2
(45) Date of Patent: Dec. 30, 2008

(54) BROADBAND ANALOG TO DIGITAL CONVERSION USING ANALOG SPECTRAL RECORDING

(75) Inventors: William R. Babbitt, Bozeman, MT (US); Mark Allen Neifeld, Tucson, AZ (US); Kristian D. Merkel, Bozeman, MT (US)

(73) Assignee: Montana State University, Bozeman, MT (US)

( * ) Notice: Subject to any disclaimer, the term of this patent is extended or adjusted under 35 U.S.C. 154(b) by 0 days.

(21) Appl. No.: 11/556,751

(22) Filed: Nov. 6, 2006

(65) Prior Publication Data

US 2007/0223936 A1    Sep. 27, 2007

Related U.S. Application Data

(60) Provisional application No. 60/734,727, filed on Nov. 7, 2005.

(51) Int. Cl.
*H03M 1/00* (2006.01)
(52) U.S. Cl. .................................. 341/133; 341/155
(58) Field of Classification Search ............... 341/133, 341/155
See application file for complete search history.

(56) References Cited

U.S. PATENT DOCUMENTS 6,288,659 B1 * 9/2001 Jalali et al. ................. 341/137
7,145,713 B2   12/2006 Chang et al.

FOREIGN PATENT DOCUMENTS

WO   WO 03/098384   11/2003

OTHER PUBLICATIONS

Moerner et al.,Statistical Fine Structure of Inhomogeneously Broadened Absorption Lines,Physical Review Letters,Dec. 1987,4pp,v59(23), American Physical Society,New York NY.

Montijo et al.,Accuracy in interleaved ADC systems,Hewlett-Packard Journal,Oct. 1993,38pp,v44(5), Hewlett-Packard,Palo Alto CA.

Merkel et al.,Compensation for homogeneous dephasing in coherent transient optical memories and processors,Optics Communications,Jul. 1996,136-144,v128,Elsevier,Amsterdam NL.

(Continued)

*Primary Examiner*—Howard Williams
(74) *Attorney, Agent, or Firm*—Evans & Molinelli PLLC; Eugene Molinelli

(57) ABSTRACT

A method and apparatus for converting an analog waveform to a series of digital values includes receiving an input analog waveform to be digitized over a particular frequency band. A phase-sensitive frequency-domain representation of the input analog waveform is recorded. The phase-sensitive frequency-domain representation is read out and digitized to produce a spectral series of digital values. An output series of digital values that represent the analog waveform digitized over the particular frequency band is determined based on the spectral series. In some embodiments, the spectral series of digital values is produced with a conventional high dynamic range, low bandwidth digitizer that has a bandwidth at least a factor of two less than a width of the particular frequency band for digitizing the target analog waveform.

40 Claims, 15 Drawing Sheets

OTHER PUBLICATIONS

Walden,Analog-to-digital Converter Survey and Analysis,IEEE Communications, Apr. 1999,539-550,v17(4),IEEE, New York NY.

Pearson,Complementary Code Keying Made Simple, cnscenter.future.co.kr, Nov. 2001, 6pp, resource/rsc-center/vendor-wp/intersil/an9850.pdf,Intersil, Milpitas CA.

De Priest et al.,HIgh-Quality Photonic Sampling Streams from a Semiconductor Diode Ring Laser,IEEE Jour. Quantum Electronics, Apr. 2002,380-389,v38(4),IEEE, New York NY.

Sun et al.,Recent progress in developing new rare earth materials for hole burning and coherent transient applications,Jour.Luminescence,2002,281-287,v98,Elsevier,Amsterdam NL.

Han et al.,Photonic Time-stretched Analog-to-digital Converter, Jour.Lightwave Technology,Dec. 2003,3085-3103,v21(12),IEEE, New York NY.

Chang et al.,Frequency-chirped readout of spatial-spectral absorption features, Physical Review A, 2004,13pp,v70,American Physical Society, New York NY.

Lavielle et al., Wideband radio frequency spectrum analyzer:improved design and experimental results, Jour. Luminescence, 2004, 75-89, v107,Elsevier,Amsterdam NL.

Chang et al., Recovery of spectral features readout with frequency-chirped laser fields,Optics Letters,May 2005,1129-1131,v30(10),Optical Society of America, Washington DC.

Han et al.,Ultrawide-Band Photonic Time-Stretch A/D Converter Employing Phase Diversity,IEEE Trans. MicrowaveTheoryTechniques,Apr. 2005,1404-1408,v53(4),IEEE, New York NY.

Schlottau et al., Spectral hole burning for wideband, high-resolution RF spectrum analysis, Optics Letters,Nov. 2005,3003-3005,v30(22),Optical Society of America, Washington DC.

Harris et al.,Multigigahertz range-doppler correlative signal processing in optical memory crystals,Applied Optics,Jan. 2006,343-352,v45(2),Optical Soc. of Am., Washington DC.

Schlottau et al,Dem. a Spatial-spectral Holographic LIDAR Range-Doppler Processor,9th Int. Conf. Hole Burning, Single Molecule and Related Spectroscopies.2006,1p,v1,Aussois FR.

Cole et al.,Unambiguous Range-doppler LADAR processing using 2 Gsps noise waveforms, manscrpt submtd Jour. Luminescence, 2006,14pp, NA, Optical Soc. Am., Washington DC.

\* cited by examiner

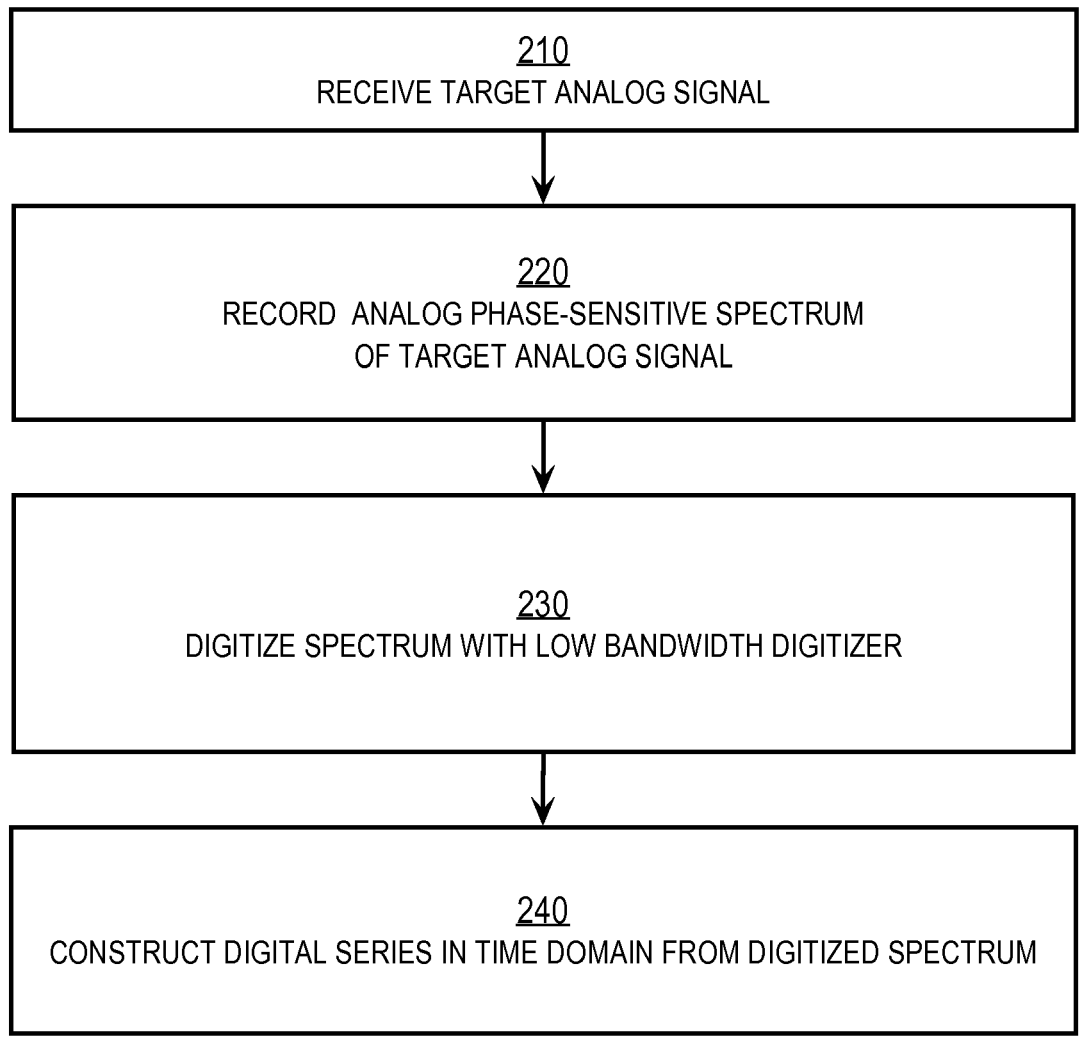

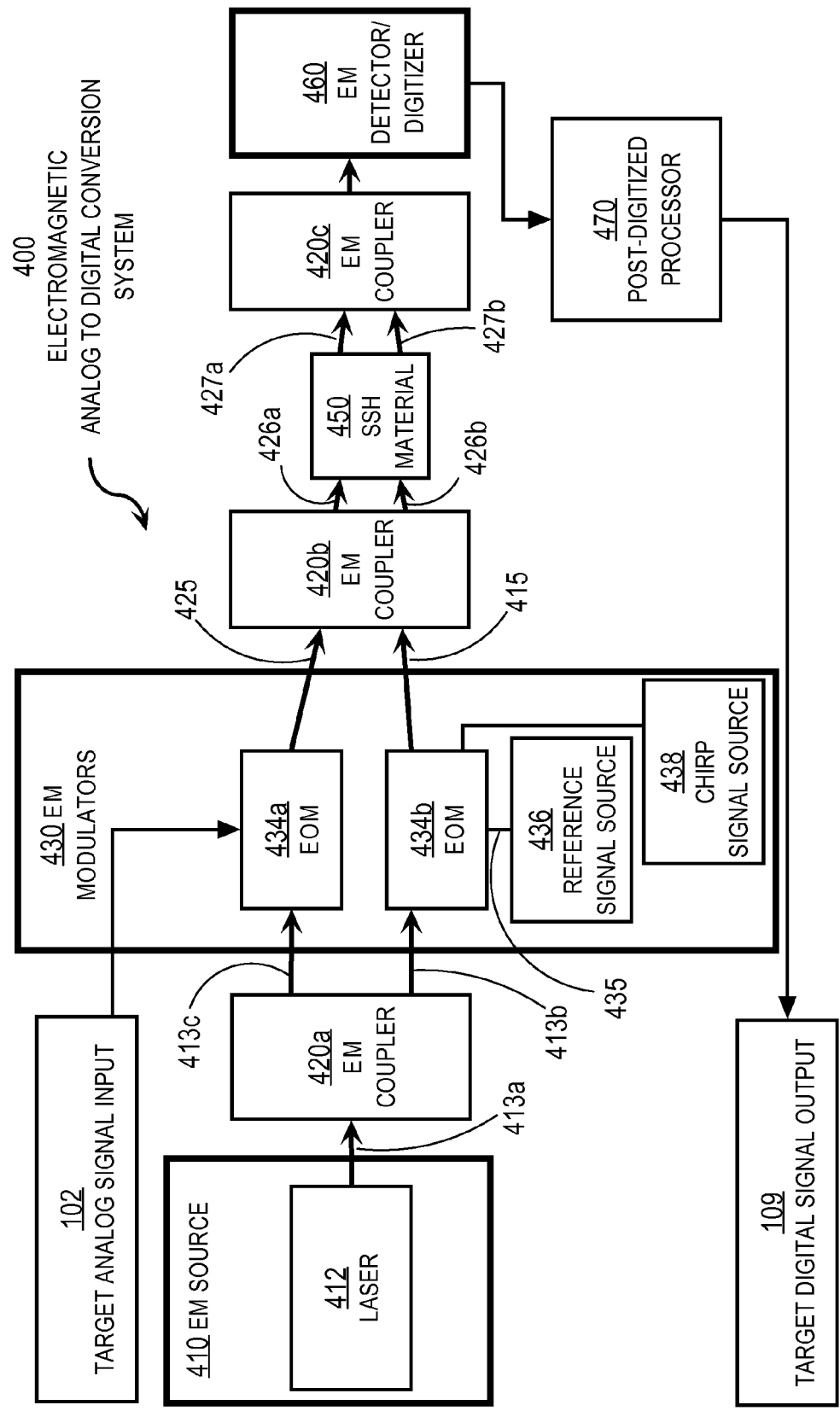

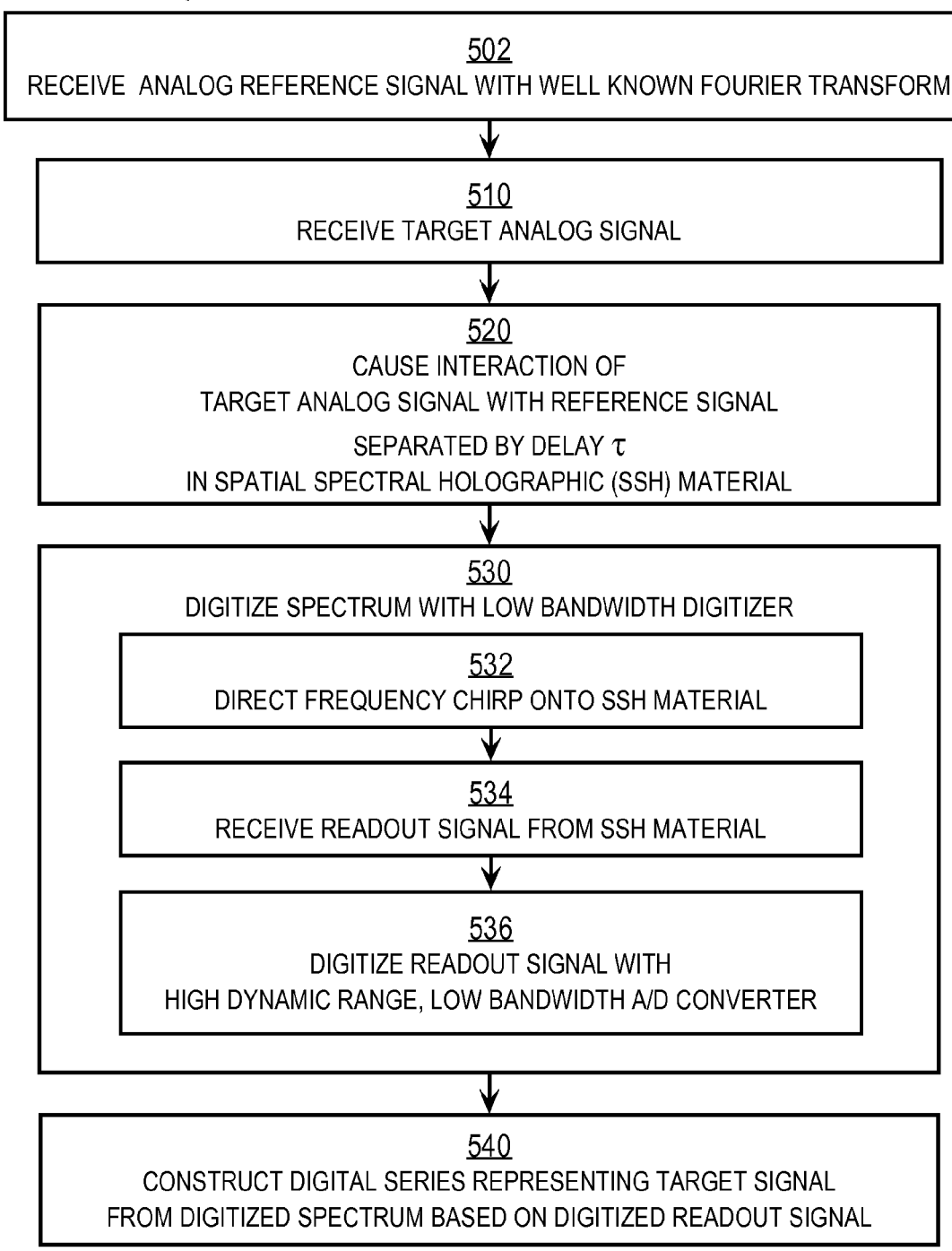

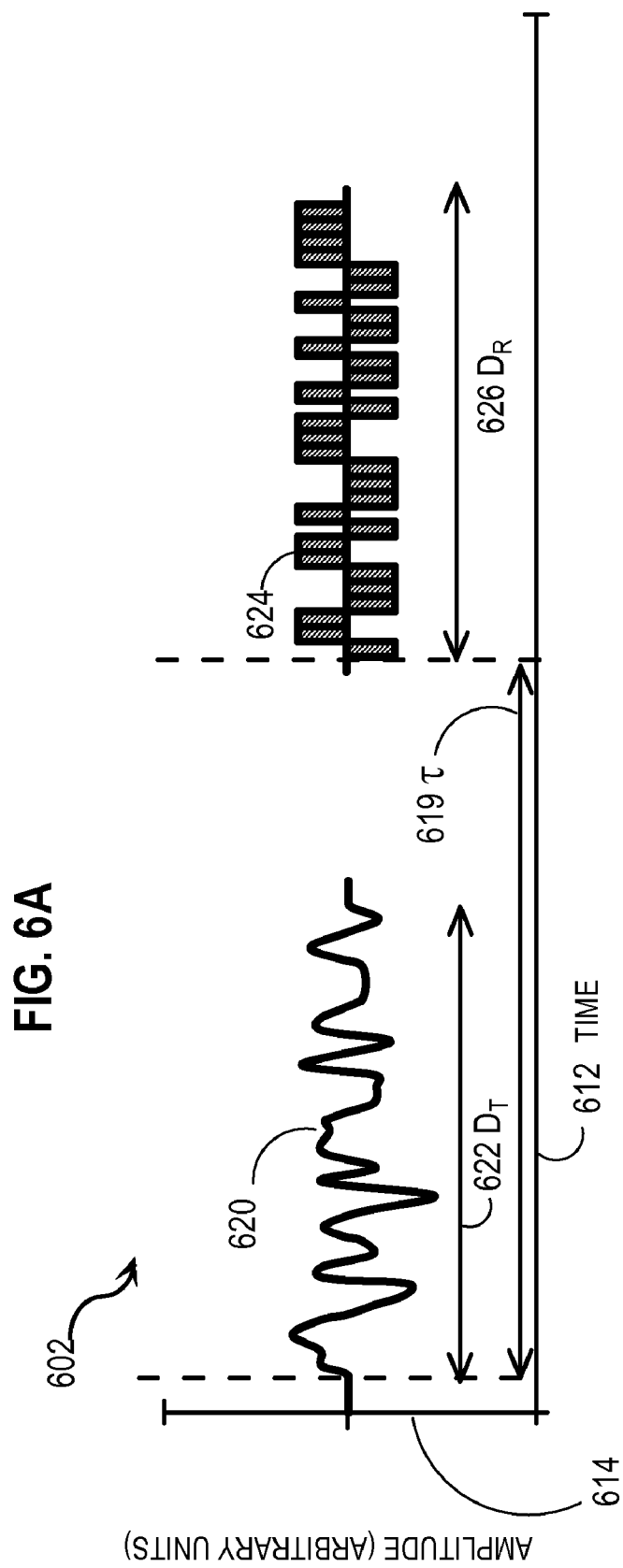

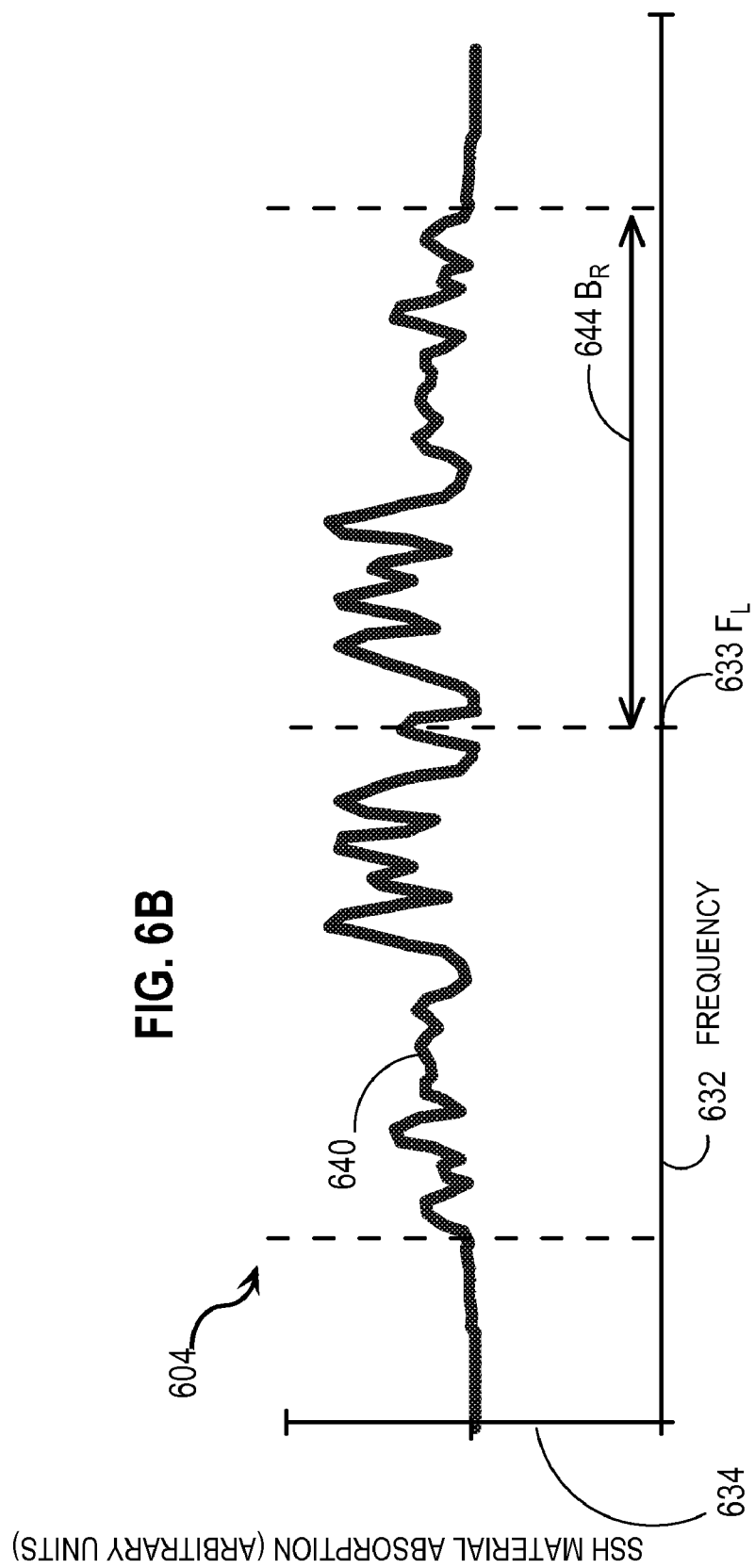

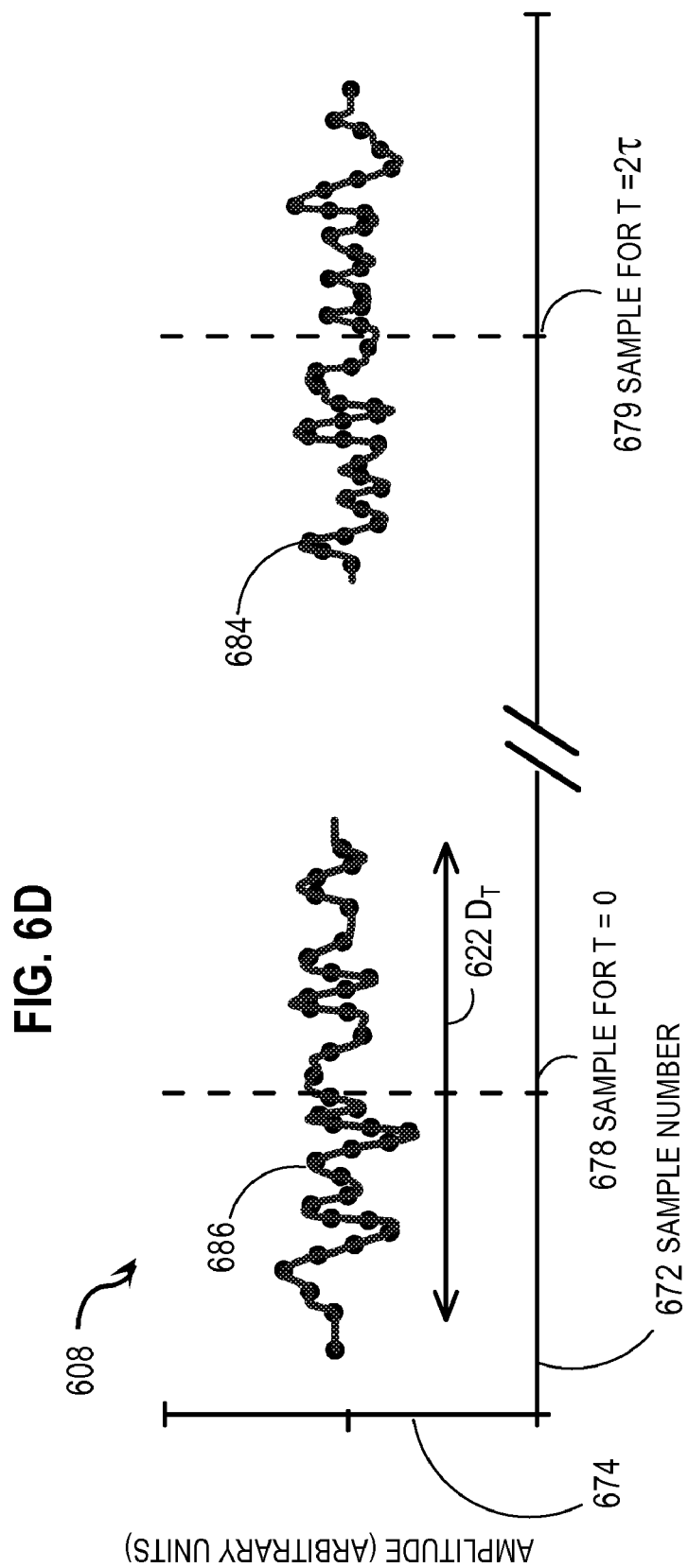

BROADBAND ANALOG TO DIGITAL CONVERSION USING ANALOG SPECTRAL RECORDING

CROSS-REFERENCE TO RELATED APPLICATIONS

This application claims benefit of Provisional Appln. 60/734,727, filed Nov. 7, 2005, the entire contents of which are hereby incorporated by reference as if fully set forth herein, under 35 U.S.C. §119(e).

STATEMENT OF GOVERNMENTAL INTEREST

This invention was made with partial Government support under Contract No. MDA972-03-1-0002 awarded by the Defense Advanced Research Projects Agency (DARPA). The Government has certain rights in the invention.

BACKGROUND OF THE INVENTION

1. Field of the Invention

The present invention relates to analog to digital conversion (ADC) at high bandwidths, such as bandwidths in the range from about 100 MegaHertz (MHz, 1 MHz=$10^6$ cycles per second) to about 1000 GigaHertz (GHz, 1 GHz=$10^9$ cycles per second) centered at an arbitrary frequency.

2. Description of the Related Art

Electronic analog-to-digital converters (ADCs, also called "digitizers") that can directly capture signals with bandwidths over 10 GHz require over $20 \times 10^9$ samples per second (SPS) and are currently limited to fewer than 7 effective resolution bits. Only modest improvements in performance are anticipated with current approaches. The current approaches include some electronic and photonic techniques that leverage the ability of currently available 0.1 Giga-samples per second (GSPS, 1 GSPS=$10^9$ samples per second) ADCs to achieve roughly 12 effective bits. High bandwidth electronic techniques include sample-interleaved ADCs, but their performance is either limited by clock jitter, component non-uniformity, and calibration issues.

Previous approaches to photonic-assisted ADC include ultra fast pulse sampling, which takes advantage of stable pulse trains from mode-locked lasers, and time-stretched waveform processing, which exploits the ability of dispersive elements to temporally stretch modulated broadband chirped pulses. In time stretching, a microwave waveform is intensity modulated onto a frequency chirped optical pulse, which is then stretched by a highly dispersive element, such as a doped optical fiber, thus reducing the pulse's intensity modulation bandwidth. The resulting signal can be captured using a lower bandwidth electronic ADC. Bandwidth enhancements (time-stretch factors) significantly greater than 10 and time-bandwidth products significantly greater than 1000 are difficult to achieve with currently available devices.

Based on the foregoing, there is a clear need for ADCs that are capable of directly capturing signals with high bandwidth and providing more effective resolution bits than is achieved with current approaches. In general, there is a need for ADCs that do not suffer all the deficiencies of current and prior approaches.

SUMMARY OF THE INVENTION

Techniques are provided for converting an analog waveform to a series of digital values.

In one set of embodiments, a method includes receiving an input analog waveform to be digitized over a particular frequency band. A phase-sensitive frequency-domain representation of the input analog waveform is recorded. The phase-sensitive frequency-domain representation is readout and digitized. An output series of digital values that represent the analog waveform digitized over the particular frequency band is determined based on the spectral series.

In some of these embodiments, the phase-sensitive frequency-domain representation is readout and digitized with a high dynamic range, low bandwidth digitizer to produce a spectral series of digital values. The low bandwidth digitizer has a bandwidth at least a factor of two less than the particular frequency band.

In some of these embodiments, the phase-sensitive frequency-domain representation is recorded in a spatial-spectral holographic material.

In other embodiments, an apparatus or logic encoded in a tangible medium when executed performs one or more steps of the above methods.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 is a flow diagram that illustrates a method to convert an analog signal to a digital signal, according to an embodiment;

FIG. 4 is a block diagram that illustrates an ADC using a spatial-spectral holographic (SSH) material, according to an embodiment;

FIG. 5A is a flow diagram that illustrates a method to convert an analog signal to a digital signal using an SSH material, according to an embodiment;

FIG. 6A is a graph that illustrates an example broadband signal to be digitized and an example delayed reference signal, according to an embodiment;

FIG. 6B is a graph that illustrates an example recorded frequency-domain absorption spectrum of an interaction between the example broadband signal and reference signal in an SSH material, according to an embodiment;

FIG. 6D is a graph that illustrates an example digitized time series of an inverse Fourier transform that includes the example broadband signal determined based on the example readout of FIG. 6C, according to an embodiment;

DETAILED DESCRIPTION

A method and apparatus are described for analog to digital conversion. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Some embodiments of the invention are descried below in the context of recording a spectrum in spectral-spatial holographic (SSH) material with an inhomogeneously broadened transition (IBT) absorption spectrum; reading the spectrum with a chirped waveform; and digitizing with state of the art high dynamic range low bandwidth ADCs. However, the invention is not limited to this context. In other embodiments other means may be used to store and readout a phase sensitive spectrum of a target signal at a rate than can be readily digitized with emerging or different ADCs.

For example, in some other embodiments a target signal and a reference waveform are modulated onto an optical beam that illuminates a conventional periodic "ruled" grating. The grating acts to spread the spectrum of the combined signals out in space (or angle). The spectrum of the combined signals is captured at a distance away from the grating with a linear array of detectors, such as an array of a charged coupled device (CCD). The captured analog spectrum is read out sequentially from the linear array at the clock rate of the detector, which can be significantly slower than the particular bandwidth to digitize the target signal. In some other embodiments, the combined signal is sent through a series of narrow band filters and the power through each filter is recorded. In some other embodiments the target signal is interfered with several sinusoidal reference beams with a range of frequencies and the signal's interference with each reference detected in phase and in quadrature to yield a phase sensitive recording of the signal's spectrum.

1. OVERVIEW

Figure 1:
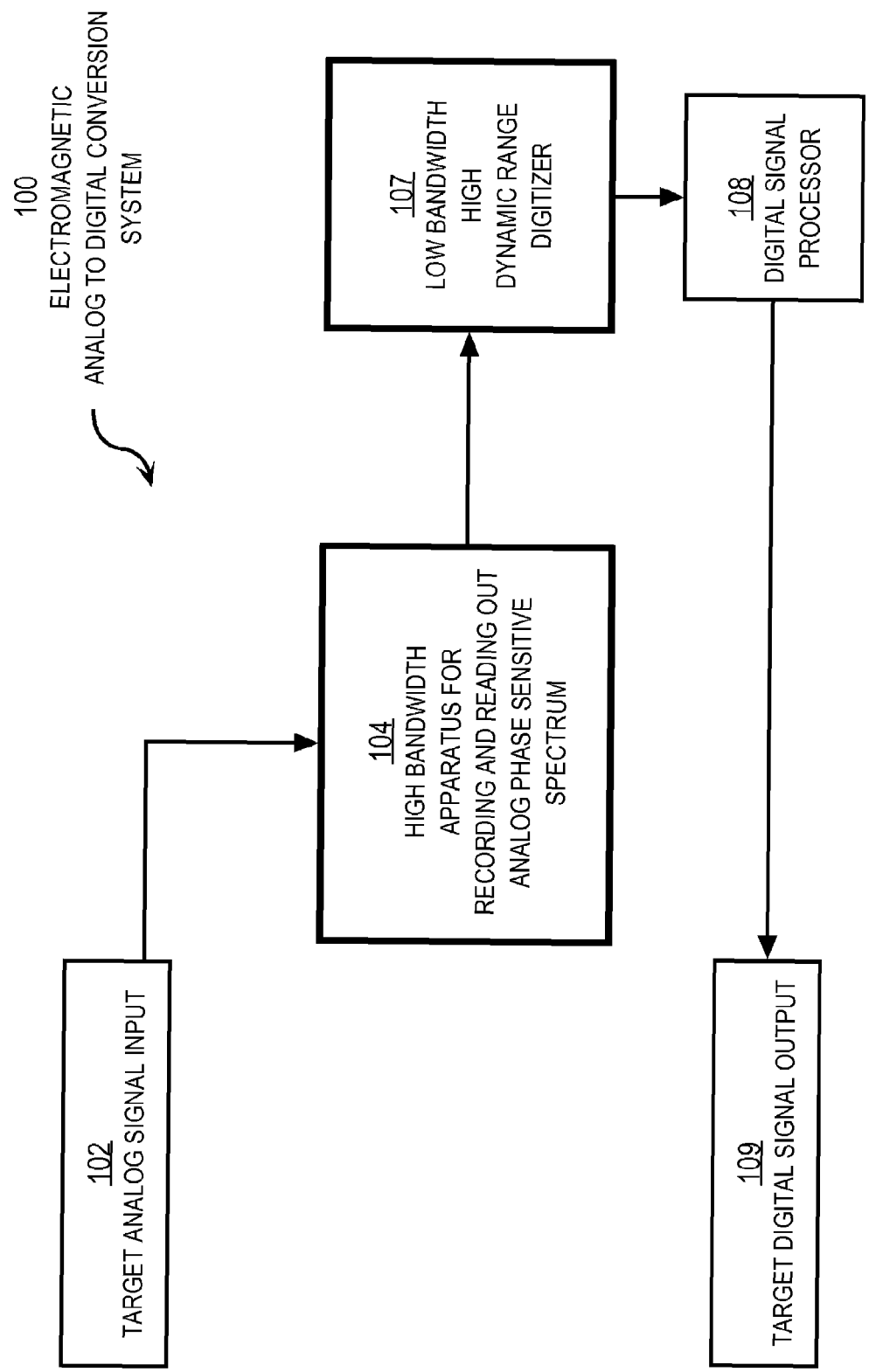
FIG. 1 is a block diagram that illustrates an analog to digital conversion apparatus (ADC), according to an embodiment.

FIG. 1 is a block diagram that illustrates an analog to digital conversion apparatus (ADC) 100, according to an embodiment. The ADC 100 includes an input 102, an output 109, a spectrum recording apparatus 104, a digitizer 107, and a digital signal processor 108.

The input 102 is a structure configured for receiving a target analog electromagnetic signal to be digitized over a particular frequency band. The particular frequency band can be a baseband (i.e., a frequency band that includes a zero frequency component) or can be a band centered at a arbitrary frequency (e.g., a carrier frequency). The input 102 can be any structure capable of carrying an analog electromagnetic signal including optical, radio wave and electronic signals. As used herein, an analog signal comprises a measurable phenomenon that is continuous in time compared to discrete time intervals that are reciprocal to bandwidths of interest. An analog signal may be comprised of discrete values for the measurable phenomenon. A digital signal, output by the digitizer, represents a series of values at discrete points in time. The sample rate of the digitizer required to capture the analog signal is roughly equal to one to two times the width of the frequency band.

The output 109 is a structure for providing the digitized signal (called herein a target digital signal output). The output 109 can be any structure capable of carrying a digital electromagnetic signal including optical, radio wave and electronic signals. As used herein, a digital signal comprises a series of values that characterize the target signal at discrete points in time. Each value is represented by a series of measurable phenomena that represent individual digits of some mathematical base, such as binary digits (bits) for base 2. The series of values represent the target signal over one or more frequency bands.

The spectrum recording apparatus 104 is a structure for recording an analog phase-sensitive spectrum of the target analog signal, typically accomplishing the recording in a time interval equal to the duration of a time segment of the analog signal that is to be recorded. The analog phase-sensitive spectrum can be retrieved from the apparatus 104 within a readout time interval. The readout time interval is typically greater than the duration of the time segment of the analog signal that is to be recorded. The bandwidth of the readout signal is typically much less than the particular bandwidth desired for the recording of the target analog signal.

The digitizer 107 is a commercially available high dynamic-range digitizer capable of digitizing the analog phase-sensitive spectrum retrieved from the apparatus 104. The bandwidth of the digitizer 107 is typically lower than the particular bandwidth at which the analog signal is to be digitized. Because the spectrum can be retrieved at a slower rate than it is recorded, the bandwidth of the digitizer is sufficient to sample the retrieved analog phase-sensitive spectrum at a rate that enables a series that represents the target signal to be constructed within the particular frequency band of interest.

The digital signal processor 108 uses the digitized phase-sensitive spectrum to construct a digital series of values. The series of values describe the target signal at discrete points in time. The time points are typically separated by evenly spaced time intervals and thus the digital series represents the target signal as though it were sampled at a particular frequency, referred to as the sample rate.

FIG. 2 is a flow diagram that illustrates a method 200 to convert an analog signal to a digital signal, according to an embodiment. Although steps are shown in the flow diagram of FIG. 2, and subsequent flow diagrams, in a particular order for purposes of illustration, in other embodiments one or more steps may be performed in a different order or overlapping in time or one or more steps may be omitted or steps may be changed in some combination of ways. For example, in some embodiments, steps 210 and 220 of method 200 are performed simultaneously.

In step 210 a target signal to be digitized over a particular frequency band is received. For example, the target signal is an optical signal received on input 102.

In step 220, an analog phase-sensitive spectrum in the frequency domain of the target analog signal is recorded. For example, an analog phase-sensitive spectrum of the target analog signal received on input 102 is recorded in apparatus 104 with high fidelity over the particular frequency band or a wider frequency band or more than one frequency band. In the illustrated embodiment, the particular frequency band is the baseband (low pass band).

In step 220, the spectrum is digitized. In the illustrated embodiment, the spectrum is digitized with a low bandwidth digitizer. For example, the spectrum is retrieved from the apparatus 104 at a slower rate than recorded and digitized at digitizer 107. Digitizer 107 operates at a low bandwidth compared to a width of the particular frequency band.

In step 240, a digital series that represents the target signal in the time domain is produced based on the digitized spectrum in the frequency domain. In some embodiments, the inverse Fourier transform of the digitized spectrum in the frequency domain produces the digital series in the time domain. The separation of consecutive samples in the time domain digital series corresponds to the particular bandwidth. For example, the digital signal processor 108, uses digital processing to make any corrections to the digitized spectrum and compute the inverse Fourier transform of the corrected spectrum to generate the digital series that represents the target signal in the time domain. The digital series is output on output 109.

Figure 3A:
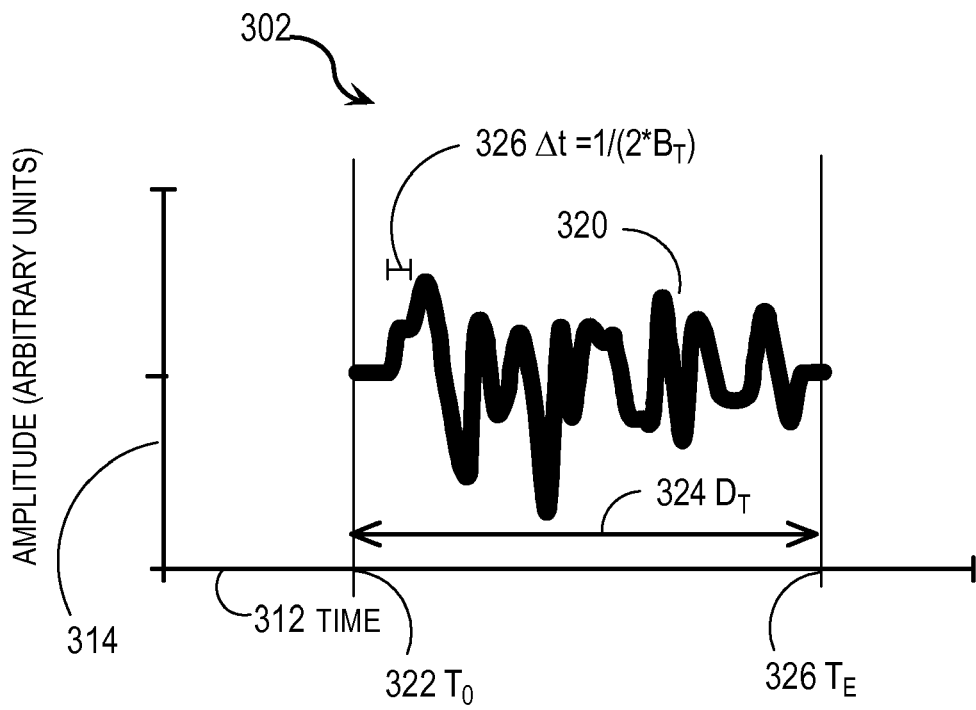
FIG. 3A is a graph that illustrates an example broadband signal to be digitized.

FIG. 3A is a graph 302 that illustrates an example broadband signal to be digitized. The horizontal axis 312 is time, increasing to the right; and the vertical axis is amplitude of the target signal in arbitrary units, increasing upward. The target analog signal 320 begins at time $T_0$ 322 and ends at time $T_E$ 326; and therefore has target duration $D_T$ 324. In some embodiments, signal 320 is a temporal slice of duration $D_T$ 324 taken from a longer signal to be digitized. It is assumed, for purposes of illustration, that the digitized signal is to have a bandwidth of $B_T$, but that ADCs of sufficient dynamic range have only an available bandwidth $B_A$ equal to about $0.01*B_T$. Typically, to capture a signal of bandwidth $B_T$ requires samples to be recorded at time points with a temporal separation 326 $\Delta t=1/(2*B_T)$. The frequency $1/\Delta t$ is often referred to as the Nyquist frequency, the desired sampling rate of the digitized signal. The time interval $\Delta t$ is roughly the duration of the shortest temporal features of interest in the target analog signal.

Figure 3B:
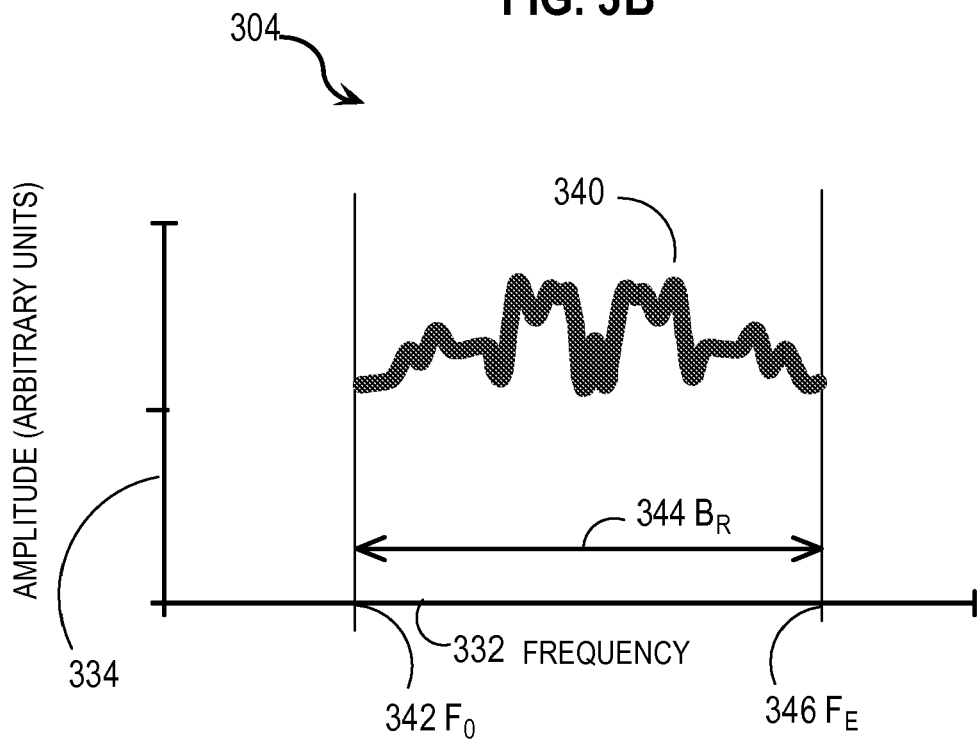
FIG. 3B is a graph that illustrates an example recorded frequency-domain spectrum of the example broadband signal, according to an embodiment.

FIG. 3B is a graph 304 that illustrates an example recorded frequency-domain spectrum of the example broadband signal, according to an embodiment. The horizontal axis 312 is frequency, increasing to the right; and the vertical axis is amplitude of a particular frequency in arbitrary units (e.g., in power density), increasing upward. The spectrum 340 begins at frequency $F_0$ 342 and ends at frequency $F_E$ 346; and has recorded bandwidth $B_R$ 344. It is desirable that $B_R$ is greater than or equal to $B_T$; and for purposes of illustration, it is assumed that this is the case.

Figure 3C:
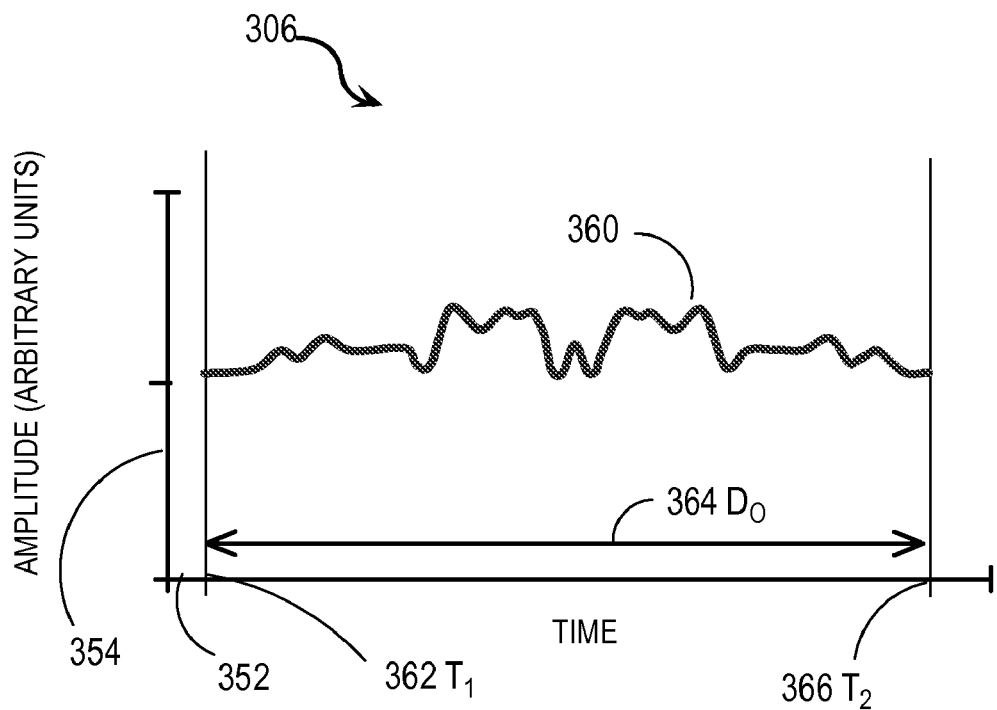
FIG. 3C is a graph that illustrates an example readout of the recorded frequency-domain spectrum of the example broadband signal, according to an embodiment.

FIG. 3C is a graph 306 that illustrates an example readout of the recorded frequency-domain spectrum of the example broadband signal, according to an embodiment. In the illustrated embodiment, the read out progresses in time to indicate the amplitude of the spectrum at different frequencies. The horizontal axis 312 is time, increasing to the right; and the vertical axis is amplitude of a particular frequency in arbitrary units, increasing upward. Each different time represents a different frequency of the frequency-domain spectrum. The readout 360 begins at time $T_1$ 362 that represents frequency $F_0$ 342 and ends at time $T_2$ 366 that represents frequency $F_E$ 346; and has readout duration $D_O$ 364. It is desirable that $D_O$ is greater than $D_T$ by at least the ratio that $B_T$ is greater than $B_A$, and for purposes of illustration, it is assumed that this is the case. It is also desirable that the readout includes phase information and it is further assumed that this is also the case.

Figure 3D:
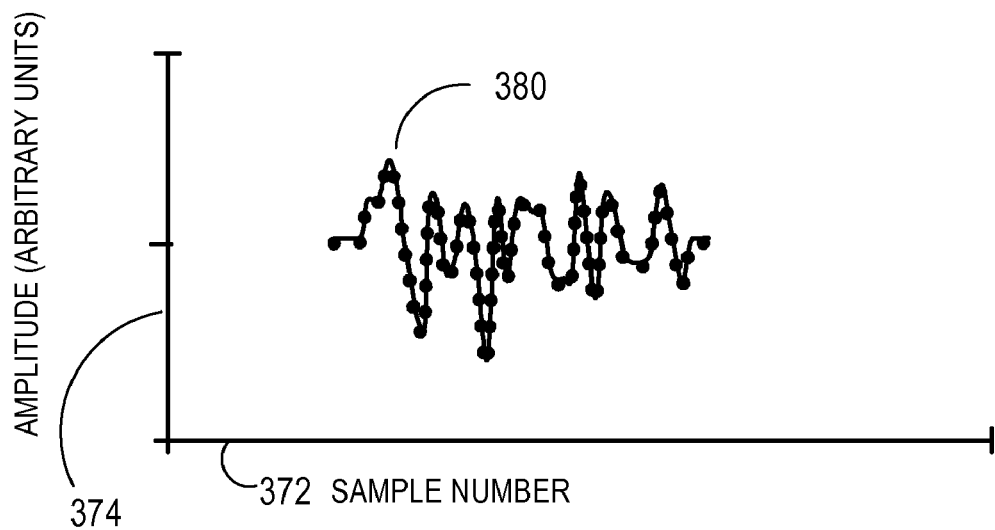
FIG. 3D is a graph that illustrates an example digitized time series of the example broadband signal determined based on the example readout, according to an embodiment.

FIG. 3D is a graph 308 that illustrates an example digitized time series of the example broadband signal determined based on the example readout, according to an embodiment. The horizontal axis 372 is sample number, increasing to the right; and the vertical axis 374 is amplitude of the target signal in arbitrary units, increasing upward. The digitized target signal 380 is output by the digital signal processor 108 and comprises multiple discrete points that well represent the original target analog signal 320. The spacing of the discrete points resolves the variations in the target analog signal at the desired temporal separation, 326 $\Delta t$, that corresponds to bandwidth $B_T$.

2. EXAMPLE EMBODIMENTS

According to some example embodiments, an SSH material is used to record an analog phase-sensitive spectrum in the frequency domain for the target analog signal.

2.1 SSH Material

The absorption features of ions or molecules doped into inorganic or organic materials are spectrally broadened by two main classes of mechanisms. Homogeneous broadening is the fundamental broadening experienced by all ions or molecules independently, and arises from a well known quantum-mechanical relationship between a transition frequency line shape and a dephasing time of an excited electron in the ion or molecule. Inhomogeneous broadening refers to a quasi-continuum of overlapping individual spectra of all of the ions or molecules in the material, which have microscopically different environments and therefore slightly different transition frequencies. When the inhomogeneous broadening of a material is significantly larger than the homogeneous broadening of a material, the material displays useful optical absorption properties and is called an inhomogeneously broadened transition (IBT) material. As described below, such a material can be used to form spatial-spectral gratings and is therefore also called a spatial-spectral (S2) material. The spatial-spectral gratings can be used to store holographic data in which the output varies with the spatial mode of observations and so the material is also called a spatial-spectral holographic (SSH) material. The latter term is used hereinafter.

Doping of certain rare earth ions in inorganic materials in a certain way produces SSH materials that are useful in broadband signal processing applications. In various materials known in the art, the absorption demonstrates optical frequency selectivity over bandwidths typically far greater than 1 GHz, and with frequency resolution typically orders of magnitude less than 1 megaHertz (MHz, 1 MHz=$10^6$ cycles per second). The frequency resolution of an SSH material is typically referred to as the homogeneous linewidth of the material. The practical limit on the maximum duration of the analog signal that can be recorded in an SSH materials is roughly the reciprocal of the material's homogeneous linewidth. For example, a material with a homogeneous linewidth of 1 MHz can record signals with duration up to roughly one microsecond. The maximum bandwidth that can be recorded by an SSH materials is roughly equal to the inhomogeneous bandwidth of the SSH material. For example, an SSH material with inhomogeneous linewidth of 100 GHz can record signals with bandwidths up to 100 GHz.

The frequency selectivity can be modified locally by interaction with optical signals that excite electrons in the ions, which serve as absorbers, from a ground state to an excited state, thereby removing those electrons from the population of ground state absorbers at that location in the material. This creates a reduction in the absorption at the resonant frequency of these ions. Therefore, some such materials have been used to form highly frequency selective spatial-spectral gratings. After some time, the electrons may return to the ground state and the grating decays with a characteristic time called the population decay time. When electrons are removed from the ground state in a particular homogeneously broadened absorption peak, a "hole" is said to be "burned" in the absorption of the material at the frequency of the hole, and light at the frequency of the hole is transmitted with substantially less absorption. A spectral hole is an example of the most simple burned spectral feature, and combinations of spectral holes at different frequencies with varying depths are here denoted as spectral features or spectral gratings. The lifetime of the spectral features is determined by the time it takes for the absorbers in the system to return to their equilibrium state. Spectral features may be made permanent in some systems.

Some SSH materials have been used as versatile optical coherent transient (OCT) processing devices. An OCT device relies on a broadband spatial-spectral grating in the optical range that extends over several homogeneous lines, and part or all of the available inhomogeneous broadening absorption profile. All the features of an optical spatial-spectral grating are typically formed substantively simultaneously by recording the spatial-spectral interference of two or more optical pulses separated in time only (purely spectral grating) or separated in both space and time (a spatial-spectral grating). A spatial-spectral grating has the ability to generate a broadband optical output signal that depends on an optical input probe waveform impinging on that grating and the programming waveforms that formed the grating In optical analog signal processing, the medium is used to store particular spectral features of interest, such as the result of the interaction of one or more optical waveforms (e.g., optical beams carrying information). See for example, U.S. Pat. No. 4,459,682 entitled "Time domain data storage," Inventor T. W. Mossberg, Issued Jul. 10, 1984 (hereinafter Mossberg), U.S. Pat. No. 4,670,854 entitled "Optical cross-correlation and convolution apparatus," Inventors T. W. Mossberg, Y. S. Bai, W. R. Babbitt, N. W. Carlson, Issued Jun. 2, 1987 (hereinafter Mossberg, Bai, et al), U.S. Pat. No. 5,239,548 entitled "Optical signal processor for processing continuous signal data," Inventors W. R. Babbitt and J. A. Bell, Issued Aug. 24, 1993 (hereinafter Babbitt and Bell), U.S. Pat. No. 6,680,860 entitled "Optical coherent transient continuously programmed continuous processor," Inventors K. D. Merkel and W. R. Babbitt, Issued Jan. 20, 2004 (hereinafter Merkel and Babbitt) and published International Patent application WO 2003/098384 entitled "Techniques for processing high time-bandwidth signals using a material with inhomogeneously broadened absorption spectrum, Inventors: K. D. Merkel, Z. Cole, K. M. Rupavatharam, W. R. Babbitt, T. Chang and K. H. Wagner, 27 Nov. 2003 (hereinafter Merkel), the entire contents of each of which are hereby incorporated by reference as if fully set forth herein.

In some circumstances, including those described by Merkel, the medium is an optically absorptive medium when most of the population is in the ground state of the two electron quantum level states. This reduces the signal level of a readout beam transmitted through the medium. However, when the population is evenly divided between the two states, and all coherent superposition states have decayed away, the medium is transparent, e.g., signal levels transmitted are essentially equal to the signal levels impinging. Furthermore, when most of the population is in the excited state, the medium is amplifying, e.g., signal levels transmitted are greater than the signal levels impinging.

In some OCT devices, the approach to accessing the information in the spatial-spectral grating is to probe that grating with a high bandwidth, Fourier-transform-limited optical signal, such as a coherent brief optical pulse, or a series of such coherent brief optical pulses. Under certain conditions, the probing of the grating can produce optical output signals that are generally referred to as stimulated photon echoes or optical coherent transients. See for example Mossberg and U.S. Pat. No. 5,369,665 "Coherent time-domain data storage with spread-spectrum data pulse," Inventors Y. S. Bai and R. Kachru, Issued Nov. 29, 1994. (hereinafter Bai), the entire contents of which are hereby incorporated by reference as if fully set forth herein. A single brief coherent light pulse with a bandwidth equal to that of the spectral grating stimulates a time-delayed output signal whose temporal profile represents the Fourier transform of the spectrum recorded in the grating structure.

While useful in many applications, the approach of readout with a high bandwidth, Fourier-transform-limited coherent brief optical pulse or series of optical pulses at the full bandwidth of processing can suffer, at present, from the limited performance in dynamic range of photo-detectors and ADCs that are needed to make a measurement of any instantaneous high bandwidth optical signal. Existing high bandwidth detectors and ADCs have limited performance and higher cost as compared to lower bandwidth detectors and digitizers.

Swept frequency modulated optical signals are called "chirped optical waveforms" herein. The frequency sweep can be linear in time with a constant chirp rate (called linear chirp or linear frequency modulation, LFM), or can be non-linear with a time varying chirp rate. Optical LFM signals have been used as probe waveforms in pulse sequences to write spatial-spectral gratings for applications of storage, signal processing, true time delay generation, and arbitrary waveform generation, and also for readout of spectral gratings. LFM probe waveforms generate a temporal output signal that represents a collective readout of all the absorbers, as with the brief pulse excitation, but under the condition of swept excitation. By properly choosing the rate of frequency change with time, called herein the chirp rate K, a temporal readout is produced that is slow enough to be digitized by low cost, high performance digitizers in the frequency bands of interest. See for example, Merkel.

The concept of using a chirped optical waveform as a probe signal has been called spectral-to-temporal mapping. Coherent interaction of resonances of the physical system with the chirped optical waveform is called a stimulated photon echo or optical coherent transient effect. Commonly, this interaction results in a response signal that is a time varying change to the amplitude and/or phase of the probe waveform. The frequency sweep rate or chirp rate, K, is defined as the frequency scan range, which equals the chirp bandwidth, B, divided by the duration of the sweep time, $\tau c$, as given by Expression 1a $$\kappa = B/\tau c, \qquad (1a)$$

In some cases, the response waveform phase and amplitude can be directly observed. For some other cases, e.g., at optical frequencies, in order to obtain the full information about both the phase and the amplitude, a heterodyne detection scheme is used, where a reference waveform interferes with the response signal. Typically the reference waveform is close in frequency with the response signal so that a lower frequency beat output is produced that is readily observable with available photo-detectors and high dynamic-range digitizers. Under some conditions, heterodyne detection is automatic, such as when the probe waveform spatially overlaps the response signal and acts as a reference, as in the case of absorption or dispersion. In other cases, the output signal is distinct from the probe waveform and a reference waveform is made to interfere with the response signal before being received by a measurement apparatus, such as a digitizing detector. In some embodiments, the reference waveform is also a chirped optical waveform.

2.2 Apparatus for High Bandwidth ADC

FIG. 4 is a block diagram that illustrates an electromagnetic (EM) ADC 400 using a spatial-spectral holographic (SSH) material, according to an embodiment. Although a certain number of components are shown in FIG. 4 for the purposes of illustration, in other embodiments more or fewer components are included in system 400. Furthermore, the components described here refer to operation for optical frequencies. In other embodiments, other equivalent or corresponding components for other electromagnetic phenomena, such as radio frequency (RF) waves and nuclear magnetic resonance (NMR) replace or add to the components described with reference to FIG. 4.

EM ADC 400 includes one or more electromagnetic source 410, electromagnetic couplers 420a, 420b, 420c (collectively referenced hereinafter as couplers 420), electromagnetic modulators 430, SSH material 450, electromagnetic detector/digitizer 460, and post-digitized processor 470. The ADC 400 includes target analog signal input 102 and target digital signal output 109 as described above for FIG. 1. The post-digitized processor 470 represents an embodiment of digital signal processor 108 of FIG. 1.

In the illustrated embodiment 400, EM source 410 includes an input laser 412. This laser 412 provides stabilized optical carrier frequency beams 413a in the TeraHertz range (THz, 1 THz=$10^{12}$ cycles per second) used to carry a target and reference signal and a chirped waveform used as a probe for readout. In some embodiments, a single laser provides the carrier frequency waveform 413a for both the target and probe waveforms. In some embodiments, additional laser sources are included in EM source 410. In some various embodiments, electric signals from a laser stabilization block (not shown) controls frequency, amplitude or phase, or some combination, for laser 412. Propagation of EM waveforms is indicated in FIG. 4 by thick straight lines with angled arrowheads. Electronic connections for signal processing and control are represented by thinner segmented lines with triangular arrowheads indicating direction for information flow.

The EM couplers 420 direct EM waveforms, such as optical carrier waveform 413a, between the various components and include such optical couplers as free space (including vacuums, and specialized and ambient atmosphere), mirrors, phase plates, optical fibers, among others well known in the art of optics and electromagnetic propagation. In the illustrated embodiment, EM coupler 420a splits carrier waveform 413a into two carrier waveforms 413b, 413c at the same optical frequency.

The EM modulators 430 modulate the carrier waveforms to produce signal waveforms with rich frequency content. In the illustrated embodiment, EM modulators 430 include electro-optic modulators (EOMs) 434a, 434b (collectively referenced hereinafter as EOMs 434). In some embodiments, one or more EOMs 434 are replaced with or added to other optical modulators such as one or more electro-optic phase modulators (EOPMs), electro-optic amplitude modulators, electro-absorption modulators, and acousto-optic modulators (AOMs). In the illustrated embodiment, EOM 434a is connected to target analog signal input 102. EOM 434b is connected to reference signal source 436 and chirp signal source 438. In some embodiments, one or both of reference signal source 436 and chirp signal source 438 include an arbitrary waveform generator (AWG) or other wave generators, such as one or more pulse pattern generators (PPGs).

In the illustrated embodiment, the target analog signal input 102 receives a radio frequency signal that is modulated onto optical carrier waveform 413c at EOM 434a. The modulated optical waveform 425 is directed onto the SSH material 450 by EM coupler 420b. In some embodiments, the target analog signal input receives an optical signal that is not modulated onto optical carrier 413c but is instead directed as waveform 425 onto SSH material 450 by EM coupler 420b; and EOM 434a is omitted. In some embodiments, the optical waveform 425 is directed by EM coupler 420b onto SSH material 450 in two spatial modes indicated by waveforms 426a, 426b. A spatial mode is a particular set of locations illuminated by one waveform propagating through the SSH material in a particular direction.

In the illustrated embodiment, phase-sensitive spectral information is provided by causing the optical waveform 425 with the target analog signal to interact with a delayed reference waveform 415 also directed onto SSH material 450 by EM coupler 420b. The effect of this interaction is described in more detail below. In the illustrated embodiment, the reference waveform is produced by modulating optical carrier waveform 413b in EOM 434b by a reference voltage signal 435 produced in reference signal source 436. In some embodiments, the reference signal source 436 is instead connected to EOM 434a to modify the same optical carrier 413c that is modulated by target analog signal on input 102, but at a different time. One method to obtain faithful reference (and chirped readout waveforms, as described below) uses a binary pulse pattern generator (PPG) mixed with a microwave source to drive an electro-optic phase modulator (EOPM) in place of EOM 434b to modulate the waveforms onto a stable optical carrier waveform. In some embodiments, the reference waveform 415 receives an optical signal that is not modulated onto optical carrier 413b but is instead directed as waveform 415 onto SSH material 450 by EM coupler 420b; and EOM 434b is omitted. In some embodiments, the two different reference waveform 415 are directed by EM coupler 420b onto SSH material 450 in two different spatial modes indicated by waveforms 426a, 426b.

The SSH material 450 records one or more waveforms 426a, 426b that impinge on the material with sufficient intensity and duration. When multiple waveforms interact in the material at different angles, spatial-spectral structures are formed in the material. When all waveforms impinge in the same direction only spectral content is recorded.

The phase-sensitive spectrum recorded in SSH material 450 is read out using a chirped optical waveform over the frequency band of interest. In some embodiments, more than one chirped optical waveform is used to read out the phase-sensitive spectrum. In the illustrated embodiment, the chirped optical waveform is produced by modulating optical carrier waveform 413b in EOM 434b by a signal produced in chirp signal source 438. As a result of illuminating the SSH material 450 with the chirped optical waveform (also represented by arrow 415), a primary response waveform represented by arrow 427a is produced and directed onto EM detector/digitizer 460 by EM coupler 420c.

For heterodyne readout processes, a heterodyne reference optical waveform (e.g., waveform 427b) is also produced in addition to the primary response waveform (e.g., 427a). Any method of generating a heterodyne reference waveform 427b may be used. In the illustrated embodiment, the heterodyne reference optical waveform 427b emerges from the optical material, usually in a spatial mode that has not recorded the target interaction from optical waveform 425, such as experienced by chirped optical waveform 415. In some embodiments, the heterodyne reference signal 427b is a chirped optical waveform (not shown) that has not passed through the SSH material 450. In some embodiments, the heterodyne reference signal 427b is a transmitted probe waveform that is naturally in the same direction as the response signal 427a that itself is often delayed. Thus, in such embodiments, the signal detected at the optical detectors 460 is naturally heterodyne. In some embodiments, the heterodyne reference waveform 427b is a response signal from the chirped optical waveform interacting with one or more spatial-spectral gratings recorded in the IBT material 450 for the purpose of generating the heterodyne reference waveform.

The EM detector/digitizer 460 includes one or more detectors such as an optical detector that detect the time-varying optical intensity in a certain optical bandwidth. In some embodiments, a one- or two-dimensional array of optical detectors is used to simultaneously detect a response waveform 427a on multiple spatial modes. Scanned or instant images can be generated by the array of detectors. In some embodiments, the EM detector 460 detects only the response waveform 427a. In some embodiments, the EM detector 460 detects the heterodyne combination of the response waveform 427a and heterodyne reference waveform 427b. For example, the heterodyne combination generates beat frequency variations that are much lower in frequency and larger in amplitude than response signal 427 intensity variations; therefore the beat frequency variations are more accurately measured with current detector/digitizer equipment. In some embodiments, the detector outputs an analog electronic signal (e.g., a continuous voltage or current signal) that is converted to discrete digital values by a separate digitizer (ADC) included in EM detector/digitizer 460. In some embodiments, the optical detector is a digital device that outputs directly a digital signal.

The post-digitized electronics in EM analyzer 470 use electrical signals output by EM detector/digitizer 460 to construct a series of digital values that represent the target analog signal with sample spacing that corresponds to the particular bandwidth desired for the digitization. For example, the post-digitized processor applies any applicable filtering and corrections to generate the phase-sensitive spectrum; and then applies an inverse Fourier transform and extracts a series of values that represent the target analog signal. The processes performed by post-digitized processor 470 are described in more detail below with reference to FIG. 5B.

The results of the processing by post-digitized processor 470 are presented at target digital signal output 109.

2.3 Theoretical Considerations

The use of the reference signal and processing performed in post-digitized processor 470 to provide phase information for the spectrum recorded in SSH material 450 is described in this section based on the following theoretical considerations, for purposes of explanation. However, the invention is not limited by the completeness or accuracy of the following description.

The SSH material responds to a broadband optical waveform by recording a high-fidelity replica of its power spectrum in the form of a modified absorption spectrum. A power spectrum, as is well known, is a real-valued function defined by a product of a complex-valued Fourier transform by its complex conjugate, where a complex value includes a real part and an imaginary part that is a factor of the square root of −1. The modified absorption spectrum can be characterized by an average modified absorption coefficient spectrum (e.g., trace 640 in FIG. 6B, described below), given to first order in the power spectrum by Equation 2a.

$$\langle \alpha(f) \rangle_L = \alpha_0 (1 - \beta \epsilon(f)) \tag{2a}$$

where $\alpha_0$ is the unperturbed absorption coefficient of the material, $\epsilon(f)$ is the optical energy spectrum of incident modulated light waveform, and $\beta$ is a conversion efficiency coefficient given by Equation 2b.

$$\beta = 2\left(\frac{\lambda}{hc}\right)(1 - e^{-\alpha_0 L})\frac{1}{(\pi r_s^2 L n_f)}, \tag{2b}$$

where $\lambda$ is the wavelength of the optical carrier, $r_s$ is the radius of the optical waveform, L is the length of the crystal, and $n_f$ is the number of absorbing ions per Hz per unit volume. The expression $\beta \epsilon(f)$ thus represents the ratio of the number of absorbed photons per Hz to the number of absorbing ions per Hz in the illuminated volume. The factor of two in Equation 2b takes into account that each absorbed photon results in a two-level ion transitioning from its ground (absorbing) state to its excited (gain) state. In embodiments that use materials with other than the illustrated two-level ions, the factor of two in Equation 2b can vary from 2 to less than 0.5.

The operation of the illustrated SSH ADC embodiment is a two step process. First, a sensitive spectral holographic recording of the complex Fourier transform of a target signal (also called a signal of interest, SOI) is captured by the SSH material. The target signal on input 102, $V_S(t)$, exists on or is modulated onto an optical carrier, along with a delayed reference signal 435, $V_R(t)$, and illuminates the SSH material. In some embodiments, the reference waveform precedes the target signal waveform. FIG. 4 shows the reference waveform 415 and target signal waveform 425 interacting at an angle (e.g., θ), which has the advantage of minimizing some of the non-linearities that occur in the collinear case (θ=0), but requires diffractive readout. For simplicity, only the collinear case is described here. The incident optical energy spectrum is given by Equation 3a.

$$\epsilon(f) \propto |V_S(f - f_L) + V_R(f - f_L)e^{-i2\pi(f - f_L)\tau}|^2 = |V_S(f - f_L)|^2 + \tag{3a}$$
$$|V_R(f - f_L)|^2 + (V_S(f - f_L)V_R^*(f - f_L)e^{i2\pi(f - f_L)\tau} + c.c.)$$

where $V_S(f)$ and $V_R(f)$ are the Fourier transforms of the target waveform on input 102 and reference waveform 435, respectively, $f_L = c/\lambda$ is the optical carrier frequency, and $\tau$ is the delay between the target signal waveform 425 and reference signal waveform 415. It is noted that the combined energy spectrum contains a spectral interference term that holds all the phase and amplitude information needed to reconstruct the target signal. The spectral interference term includes a product term and the complex conjugate (c.c.) of the product term. In the illustrated embodiment, only the product term is used. In other embodiments, the complex conjugate is used by itself or in conjunction with the product term to obtain improved signal to noise. The strength of optical sidebands depends on the modulation depth of the EM modulators 430 used to convert the voltage waveforms, if any (e.g., on input 102 and reference 435) to optical waveforms (e.g., waveforms 425 and 415). Here is considered only the upper sideband of the optical signal. The lower sideband contains similar information and, if included in some embodiments, improves the signal to noise ratio. The residual optical carrier is ignored in this analysis.

The second step in the operation of the illustrated SSH-ADC embodiment is the readout process. The modified absorption profile results in a transmission transfer function given by $T(f)=\exp(-\langle\alpha(f)\rangle L)$, which is read out with one or more chirped optical waveforms, as shown in FIG. 4. Because the modified absorption persists for several milliseconds in the SSH material, the readout time may be much longer than the duration of the target signal, which is often several microseconds long. This longer duration readout of the signal in the frequency-domain is the effective stretched processing that enables SSH ADCs to utilize low speed commercial ADCs to digitize broadband microwave signals, as illustrated in FIG. 4. The frequency scan rate is chosen so as to fully capture the optical spectrum with sufficient resolution within the material population decay time.

A conventional spectroscopic approach to scanned readout says that the scan rate should be less than $\delta f^2$, where $\delta f$ is the spectral resolution of interest. For the SSH ADC embodiment, $\delta f$ should be greater than the reciprocal of the captured signal's duration, according to the convention. A disadvantage of this approach is that readout of the frequency-domain waveform might take longer than the material lifetime. A recently developed spectral recovery technique allows scan rates over 1000 times faster than the conventional approach, making this technique a useful element of the illustrated SSH ADC embodiment. Artifacts introduced by the fast readout are corrected digitally in post digitized processing, as described below with reference to FIG. 5B. With spectral recovery, a 20 GHz scan in 2 milliseconds can achieve <30 kHz resolution. The technique produces a digitized replica of the absorption spectrum, $\langle\alpha(f)\rangle$, where $\kappa$ is the frequency scan rate and $t=0$ is when the scan laser frequency would extrapolate to $f_L$. This is related to the desired quantities by equation 3b.

$$\langle\alpha(f)\rangle_L \propto |V_S(f')|^2 + |V_R(f')|^2 + (V^*_R(f')V_S(f')e^{+i2\pi f'\tau} + V_R(f')V^*_S(f')e^{-i2\pi f'\tau}) \quad (3b)$$

where $f'=f-f_L=\kappa t$

After a digital absorption spectrum is acquired, digital high-pass-filtering is applied to remove the terms $|V_S(f')|^2 + |V_R(f')|^2$. This works best when the target and delayed reference waveforms are temporally well separated. In the illustrated embodiment, the high-pass-filtered signal is then multiplied by the Fourier transform of the delayed reference signal (or its complex conjugate) yielding a signal $S_M$ given by Equation 4.

$$S_M \propto V_R(f')e^{-i2\pi f'\tau}(V^*_R(f')V_S(f')e^{+i2\pi f'\tau} + V_R(f')V^*_S(f')e^{-i2\pi f'\tau}) \quad (4)$$

The phase factor $e^{-i2\pi f'\tau}$ is included in the factor that multiplies the high-pass-filtered signal in order to have the output digitized signal centered at time $t=0$. This is only for convenience in comparing the digitized output signal to the target output signal about $t=0$. If this factor is not included, the digitized signal of interest is centered at time $t=\tau$. If the complex conjugate of the Fourier transform of the reference signal is instead used as the multiplying factor (with or with a phase factor), then the second product term of equation 3b becomes the term of interest. In the illustrated embodiment, after performing an inverse Fourier transform on $S_M$ back into a time-domain signal $V_{out}(t)$, the result is given by Equation 5.

$$V_{out}(t) \propto (V_R(t) \otimes V_R(t)) \oplus V_S(t) + (V_R(t_L) \oplus V_R(t_L)) \oplus V_S(2\tau - t) \quad (5)$$

where $\oplus$ and $\otimes$ represent the operations of convolution and correlation, respectively. The first term can be isolated from the second term provided the delay $\tau$ (e.g., the time interval between the start of the target signal and the start of the reference signal) is greater than the duration of the signals. If the autocorrelation of the reference signal has a strong autocorrelation peak (i.e. low sidelobes), then the output signal about $t=0$ will closely mimic the target signal. In some embodiments, where the high-pass-filtered signal is then multiplied by the complex conjugate of the Fourier transform of the delayed reference signal, a time reversal process can be employed to obtain an output signal that mimics the target signal.

In some embodiments, long pseudo-random codes are used as reference waveforms so that $V_R(t) \otimes V_R(t)$ approaches a delta function, which has a value 1 at $t=0$ and low sidelobes at all other times. This is equivalent to a particular product in the frequency domain, $V^*_R(f) \times V_R(ft)$, being relatively constant over the frequency band of interest, within about a factor of two. To enhance the fidelity, in some embodiments, further processing is performed to de-convolve the auto-correlation of the reference signal from $V_{out}(t)$. In some other embodiments, instead of multiplying the high pass-filtered signal by the Fourier transform of the reference waveform or its complex conjugate, the high pass-filtered signal is multiplied by a filter function that better suppresses sidelobe interference for a given reference waveform. Examples of filter functions that suppress sidelobes are inverse filters, psuedoinverse filters, and Wiener filters, well known in the art. In some embodiments, the reference analog waveform has discrete amplitudes that are easily generated with conventional electronics, while the filter function is a complex continuous function that is readily computed by a digital processor.

Faithful capture of the target signal over a particular frequency band depends on the bandwidth of the reference waveform equaling or exceeding the bandwidth of the particular frequency band. A possible reference waveform (one that does not produce sidelobe interference) is a single brief pulse with enough energy to excite roughly 50% of the ions. But since such pulses are difficult to produce, some embodiments employ a more practical approach that yields side-lobe free conversion. In these embodiments a "dual capture" technique utilizes a pair of complementary codes. When the power spectra of two complementary codes are added, the sum is flat over the bandwidth of the codes. Thus, when the auto-correlations of the two complementary codes are added, their sidelobe structures cancel. Complementary codes are well known in the art (see, for example, Bob Pearson, "Complementary Code Keying Made Simple," November 2001, by INTERSIL™, Milpitas, Calif., published on the Internet at domain cnscenter.future.co.kr, in directory resource/rsc-center/vendor-wp/intersil, in file an 9850.pdf, the entire contents of which are hereby incorporated by reference as if fully set forth herein). In this embodiment, two recordings of the target signal are made, one with one code of the complementary pair as the reference waveform and the other recording with the other code of the complementary pair as the reference waveform. Each recording in the "dual capture" technique is processed using the respective Fourier transform of the complementary code as the filter function. Adding the two resultant digitized signals greatly reduces the sidelobe interference effects that occur when using a single reference waveform and a single filter function. The effect is achieved in an apparatus with a single optical modulator for the target signal and a waveform splitter within EM coupler 420b that directs the modulated optical signal to two laser spots, along spatial modes indicated by waveforms 426a and 426b, where they interfere with different complementary codes as reference waveforms. One complementary code of the pair is directed along spatial mode 426a and the other along spatial mode 426b. By adding the two resulting digitized outputs, the convolved sidelobe structures are greatly reduced, yielding a more faithful digital capture of the target signal. The advantage of using complementary coded waveforms is that binary complementary code pairs of arbitrary length can be generated and faithfully modulated onto optical carriers with conventional electronics and modulators at high bit rates—exceeding 40 gigabits per second (GBPS) with current technology.

2.4 Method for High Bandwidth ADC

FIG. 5A is a flow diagram that illustrates a method 500 to convert an analog signal to a digital signal using an SSH material, according to an embodiment.

In step 502 an analog reference signal with well known Fourier transform is received. For example, the reference signal source 426 produces an analog RF reference signal 435 $V_R(t)$ with a well known Fourier transform $V_R(f)$, such as one or both of a pair of complementary code signals. The reference signal is selected to have a bandwidth $B_R$ commensurate with the target digitizing bandwidth $B_T$.

In step 510, a target analog signal is received. For example, the target analog signal input 102 receives an analog RF target signal $V_S(t)$ of duration $D_T$. A longer target analog signal can be broken up into multiple segments of duration $D_T$ or less.

In step 520, the target analog signal and the reference signal separated by a delay τ are caused to interact in an SSH material. For example, the target analog signal on input 102 is used to modulate optical carrier waveform 413c in EOM 434a to produce an optical target analog waveform 425 which is split into two optical beams 426a, 426b in a waveform splitter in EM coupler 420b. One or two reference waveforms 435 generated by reference signal source 436 is modulated on one or two optical carriers 413b to produce optical reference waveforms 415. These are separately combined with the target analog waveform in EM coupler 420b after a delay τ with each of the two split beams 426a, 426b from optical target analog waveform 425. The one or two beams impinge on SSH material 450 at one or two different spatial modes (location and direction through SSH material) indicated by beams 426a, 426b. At each spatial mode, a phase-sensitive spectrum in the frequency domain is recorded.

Because the illustrated SSH ADC embodiment actually captures the optical waveform, either a phase or amplitude modulator can be used in modulators 430 during step 520. However, the modulators are preferably not over-driven, which typically sets the maximum voltage of the target signal at the modulator to be significantly less than the $V_\pi$ of the modulator. The optical waveform can be amplified after modulation to make up for the modulator's low conversion efficiency.

FIG. 6A is a graph 602 that illustrates an example broadband signal 620 to be digitized and an example delayed reference signal 624, according to an embodiment. The horizontal axis 612 is time and the vertical axis is electrical waveform amplitude on the optical carrier waveform. The target analog signal 620 is of duration $D_T$ 622. The reference analog signal 624 is of duration $D_R$ 626 and begins after the start of the target analog signal 620 by the delay τ 619. The reference analog signal 624 has a known Fourier transform. Although the reference signal comprises electrical waveform amplitudes that vary systematically among discrete values of −1, 0 and 1 in integral intervals of time, the variations are continuous on the optical carrier and are not temporally discrete, and are therefore considered analog and not digital signals for purposes of this description. Reference waveforms with values of other than −1, 0, and 1 may be used in some embodiments, but are harder to produce with conventional electronics at high data rates.

FIG. 6B is a graph 604 that illustrates an example recorded frequency-domain absorption spectrum 640 of the interaction of the example broadband signal and reference signal in an SSH material (e.g., material 450), according to an embodiment. The horizontal axis 632 is frequency and the vertical axis is absorption in arbitrary units. The spectrum 640 is centered on the optical carrier frequency $F_L$ 633 (several THz) and has a bandwidth $B_R$ 644 that is greater than or equal to the desired target digitizing bandwidth $B_T$. An SSH material is capable of storing high bandwidth absorption spectra of $B_R$ equal to 100 GHz or more.

Referring again to FIG. 5A, after the spectrum (e.g., spectrum 640) is stored in step 520, control passes to step 530. In step 530, the spectrum is digitized with a low bandwidth digitizer. In the illustrated embodiment, step 530 includes steps 532, 534, 536.

In step 532, a chirped optical waveform that spans the bandwidth of interest is directed onto the SSH material. For example, a low amplitude chirped signal, that does not significantly reconfigure the atomic states of the material and change the absorption spectrum, is generated in chirp signal source 438 and modulated onto optical carrier 413b to form chirped optical waveform 415 that is directed by EM coupler 420b onto SSH material 450. The chirp is considered an analog waveform in this description. In some embodiments, the chirp is directed onto two spatial modes through SSH material 450, indicated by beams 426a, 426b to read out the spectra produced in the two spatial modes by the two complementary reference waveforms that interacted with the target analog signal.

In step 534, a readout signal from the SSH material is received. For example, a primary response signal 427a and a heterodyne reference signal 427b are emitted by SSH material 450 and directed by EM coupler 420c to be received by one or more detectors in detector/digitizer 460.

Figure 6C:
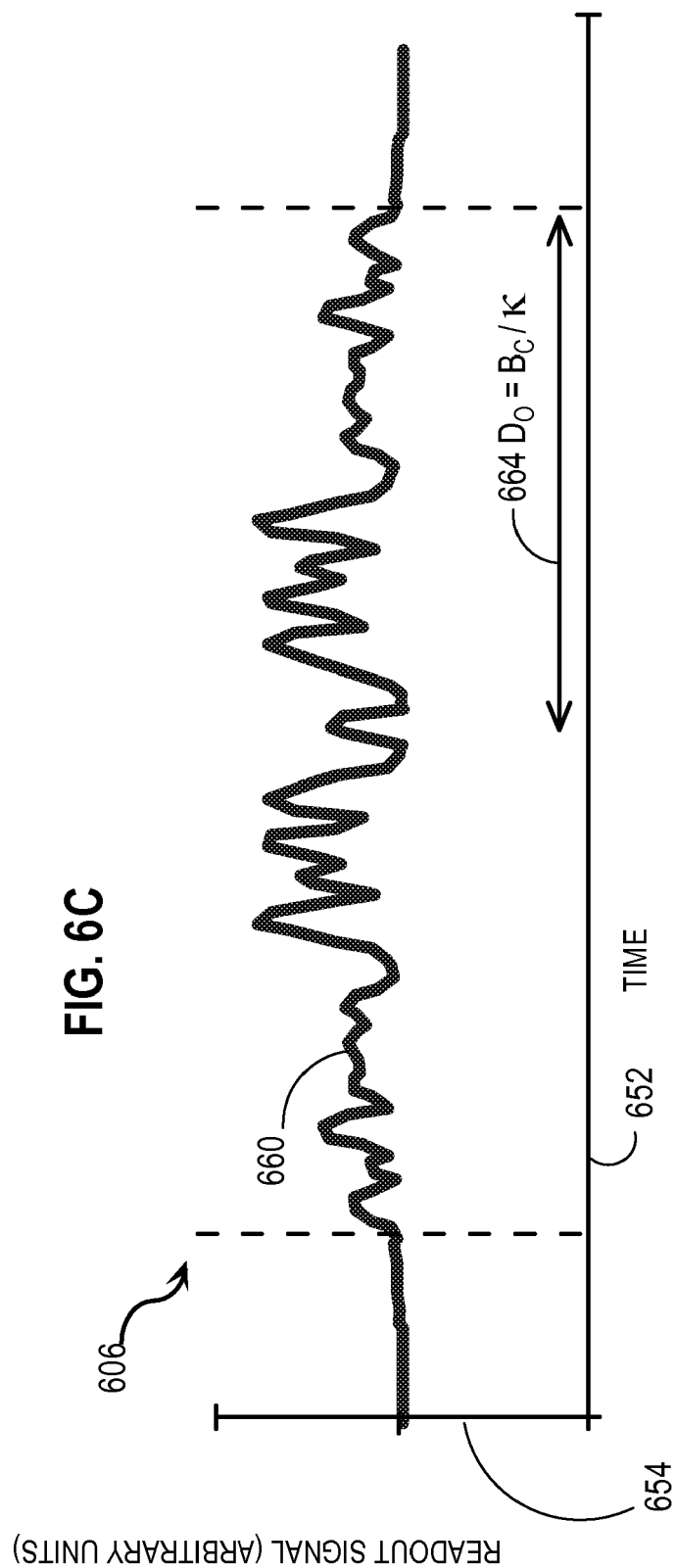
FIG. 6C is a graph that illustrates an example temporal readout of the recorded frequency-domain absorption spectrum of FIG. 6B, according to an embodiment.

FIG. 6C is a graph 606 that illustrates an example readout 660 of the recorded frequency-domain absorption spectrum of FIG. 6B, according to an embodiment. The horizontal axis 652 is time and the vertical axis 654 is readout signal strength, such as optical energy. Although the readout spectrum in FIG. 6C is identical in shape to the recorded spectrum in FIG. 6B, in some embodiments with fast chirp readout, spurious oscillations are included in readout 660. Such spurious oscillations are easily corrected in subsequent digital processing, as described in U.S. patent Ser. No. 11/179,765 filed Jul. 12, 2005 entitled "Techniques for Recovering Optical Spectral Features Using a Chirped Optical Waveform," by T. Chang, M. Tian, W. R. Babbitt and K. Merkel (hereinafter Chang), the entire contents of which are herby incorporated by reference as if fully set forth herein.

The readout signal has duration $D_O$ 664 that is equal to the chirp bandwidth $B_C$ divided by the chirp rate κ. In the illustrated embodiment, the chirp bandwidth $B_C$ is equal to the recorded bandwidth $B_R$ and captures the entire recorded spectrum 640. However, it is sufficient for the chirp bandwidth $B_C$ to equal the desired target digitizing bandwidth $B_T$. It is desirable that $D_O$ be much longer than $D_T$ so that available ADCs can capture sufficient samples of the readout 660 to provide a high bandwidth representation of the target analog signal. The chirp rate K is chosen so that $D_O$ is long enough to obtain sufficient samples from available ADCs. For example, when the desired target bandwidth $B_T$ is 100 times the bandwidth of available ADCs, then it is desirable for $D_O$ to be 100 times $D_T$; and κ is chosen to provide this ratio. In embodiments using dual capture of interactions with reference signals for each code of a complementary pair, the readout includes the scanned output from the second spatial mode, either at a later time or on another channel from a second detector/digitizer.

Referring again to FIG. 5A, in step 536, the readout signal (e.g., readout 660) is digitized by a high dynamic range, low bandwidth ADC, such as is commercially available currently at low relative cost. In some embodiments, the readout signal is digitized by the detector, e.g., with a built in commercial ADC. In some embodiments, an analog electrical signal from the detector is digitized by a separate component, e.g., a separate commercial ADC.

The lower bandwidth electronic ADC used to capture the readout signal preferably has a bandwidth capable of recording frequencies greater than the maximum delay in the input sequence times the chirp rate used to read out the spectral grating. For delays of several microseconds and chirp rates of tens of gigahertz per millisecond, a 100 MSPS ADC is adequate. For a 10 GHz version of the SSH-ADC described in more detail below, the stretch factor is about 100 and the time-bandwidth product of a single captured waveform is about 10,000. Both factors are significantly greater than conventional time-stretch ADC processors.

Figure 5B:
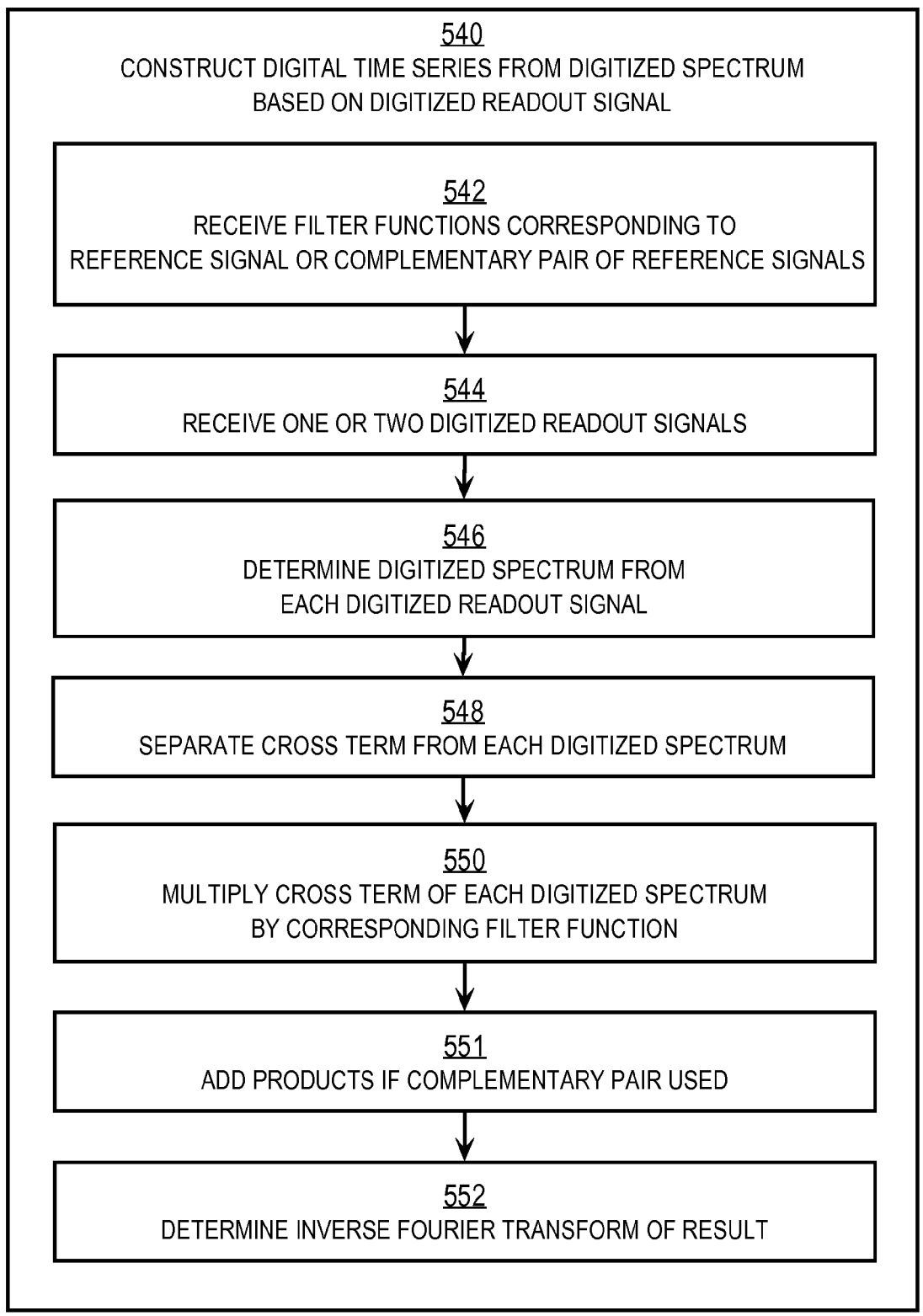
FIG. 5B is a flow diagram that illustrates a step of the method of FIG. 5A, according to an embodiment.

In step 540, a digital series that represents the target signal is constructed from the digitized spectrum based on the digitized readout signal (e.g., digitized series of readout 660). For example, step 540 is performed by post-digitized processor 470. FIG. 5B is a flow diagram that illustrates step 540 of the method of FIG. 5A, according to an embodiment. According to this embodiment, step 540 includes steps 542, 544, 546, 548, 550, 551, 552.

In step 542, a filter function corresponding to the reference signal is received. For example, in various embodiments, the filter function is an inverse filter for the reference signal, a psuedoinverse filter for the reference signal, or a Weiner filter. In some embodiments, such as embodiments using a pair of complementary codes as reference signals, the filter function is the Fourier Transform of the reference signal for each of the two complementary code reference signals. In some embodiments, the filter function remains unchanged for each time the system captures an analog signal, provided the same reference signal is used each time. In these embodiments, the reference waveform and its corresponding filter are received once and used for processing all analog signals or portions thereof. For example, if $V_R(t)$ is the reference signal 624, a digital series representing the Fourier transform of the reference signal $V_R(f)$ is received as the filter function and stored in step 542. In some embodiments, the filter function is the complex conjugate of the Fourier transform of the reference signal. In these embodiments, a digital series representing $V^*_R(f)$ is received and stored in step 542. In some embodiments, the reference signal $V_R(t)$ is received and the appropriate corresponding filter function is computed by post digitized processor 470.

In step 544, the digitized readout signal is received. For example, a digitized series of values representing the readout 660 is received at post-digitized processor 470 from EM detector/digitizer 460.

In step 546, a digital series of values that represents the spectrum is determined from the digitized series of readout signal values. For example, spurious oscillations caused by a high value of K relative to the square of the width of the smallest spectral feature are removed using the technique of Chang. The result is a series of values that represent the power spectrum of the right side of Equation 3b.

In step 548, the cross term is separated from the digitized spectrum. This is done with a high pass filter that removes the effect of the relatively constant terms $|V_S(f')|^2+|V_R(f')|^2$ from the right side of Equation 3b in the series of values.

In step 550, the remaining cross terms are multiplied by the appropriate filter function corresponding to the reference signal, received during step 542, for the series of values. This step yields a series of values that represents $S_M$ from Equation 4.

In step 551, two products from step 550 for the pair of complementary codes are added together to form $S_M$. This reduces the effects of sidelobes. In embodiments that do not use a pair of complementary codes, step 551 is omitted.

In step 552, the inverse Fourier transform of $S_M$ is determined. Any method may be used. In some embodiments, a fast Fourier Transform computation is made using a general purpose computer. In some embodiments, a digital signal processor (DSP) performs the computation in hardware. This step yields a series of values that represents $V_{out}(t)$, from Equation 5. FIG. 6D is a graph 608 that illustrates an example digital series of an inverse Fourier transform that includes the example broadband signal determined based on the example readout of FIG. 6C, according to an embodiment. The horizontal axis 672 represents sample number for the series of values, increasing to the right. The vertical axis 674 represents value of the sample, in arbitrary units. The sample number at position 678 represents a time of 0 and the sample number at position 679 represents a time of $+2\tau$. A portion 686 of the series of values is centered at $t=0$ and a portion 684 of the series of values is centered at $t=2\tau$. In some embodiments that use a pair of complementary codes, step 551 and 552 are reversed in order, where the inverse Fourier transforms of the two $S_M$ are determined and the results are added together.

In the illustrated embodiment, the values at samples centered around position 678 ($t=0$) represent the term $(V_R(t) \otimes V_R(t))|V_S(t)$ of Equation 5. Since $(V_R(t) \otimes V_R(t))$ represents the autocorrelation of the reference function with itself chosen to have a strong autocorrelation peak, it has a value near 1 at time 0 and negligible elsewhere, which when convolved with $V_S(t)$ produces an output signal that closely matches $V_S(t)$. Thus portion 686 represents the digitized values for the target signal, the output of interest. Portion 686 represents duration $D_T$. The values at samples centered around position 679 ($t=2\tau$) represent the term $(V_R(t) \oplus V_R(t)) \otimes V_S(t)$ of Equation 5; and are not of particular interest, but can be processed to enhance system signal to noise. This term is significant for durations up to the longer of $D_R$ and $D_T$. The two portions 686 and 684 are well separated when τ is greater than the longer of $D_T$ and $D_R$. Thus in step 520, described above, τ is selected to be greater than the longer of $D_T$ and $D_R$. When the two portions are well separated, the first portion 686 is output on the target digital signal output 109 during step 540.

2.5 Dynamic Range

The dynamic range of a digitizer using the above method depends on the noise in the digitized signal. There are six main sources of distortion and noise considered when analyzing the performance of the illustrated embodiment. 1) Non-linear distortion can occur if the incident optical waveform coherently saturates the SSH material. This distortion is avoided by ensuring that the term $\beta\epsilon(f)$ is much less than unity at all frequencies. 2) One source of "noise" is introduced during the material's growth and is constant for all subsequent uses of the material. The number of ions per Hertz in the interaction volume has a Poisson distribution and leads to statistical fine structure on the inhomogeneous line. The uncertainty in the number of ions in any given frequency bin is however fixed for all time for any given interaction volume and thus can be measured and removed from the captured waveform in post-processing. 3) During the recording process, the number of photons absorbed per given frequency bin is governed by Poisson statistics. 4) The homogeneous broadening distorts the recorded waveform if the target signal and reference signals are not either pre- or post-compensated. This compensation comes with a price of reduced input energy and thus reduced efficiency. 5) Distortion can be introduced during readout due to both the exponential dependence of the absorption process and to dispersive effects. Techniques have been developed to correct for the dispersive effects and allow faithful and fast readout of spectral gratings. The exponential dependence is handled in the post-processing. 6) The shot noise on the detected transmitted optical waveform is one of the dominant sources of noise in the illustrated embodiment and depends on the absorption and the number of photons that can be used to interrogate each frequency bin, which is limited by saturation.

An SSH ADC simulator was developed that includes all of the above effects except for coherent saturation and fast readout, both of which require time ordered integration of the optical fields to accurately simulate. The effects of coherent saturation were independently studied and it was found that if the maximum excitation was kept below 10%, then the distortions introduced in the illustrated SSH ADC embodiment process are below the level that would effect 10-bit digitization. The maximum excitation is monitored in the simulator and kept below 10%.

For faithful capture, the frequency resolution desired is approximately the reciprocal of the signal duration (e.g., $D_T$). The number of detected photons per frequency bin depends on the number of photons per frequency bin in the scanned readout waveform. To avoid loss of readout sensitivity due to saturation in the measurement of differential absorptions, the number of read photons per frequency bin is chosen to be less than or equal to the numbers of ions per frequency bin in the illuminated spatial volume. This relationship was used to fix the maximum readout waveform power in the simulator.

The SSH ADC simulator was used to analyze the capture of a 10 GHz analog waveform. The simulation parameters were based on a currently available SSH material and on conventional optical components. The waveform was 820 nanoseconds (ns, 1 ns=$10^{-9}$ seconds) in duration and generated by a random number generator with uniform probability distribution between $-1$ and $1$ and then filtered by a 10 GHz (3 deciBels, dB) filter. The "dual capture" processing technique was performed using two length 32768-bit 40 gigabits per second (GBPS) binary ($-1$ or $1$) complementary codes as the reference waveforms. The 40 GBPS rate was chosen to provide a sufficiently broad linear signal response of the SSH ADC device, whose filter function is a sinc function raised to fourth order (due to the double auto-correlation with the reference waveforms) multiplied by a raised cosine filter used in the readout process to isolate the main lobe of the sinc function. The 3 dB bandwidth of the SSH ADC response is 10.3 GHz. The target analog signal and complementary codes are assumed to be faithfully amplitude modulated onto optical carrier waveforms. The material simulated was 0.06% Er:LiNbO$_3$ which means that Erbium (Er) replaces 0.06% of the Lithium (Li) ions in the lithium niobate (LiNbO$_3$) crystal, which has an absorption coefficient $\alpha$ of 3 cm$^{-1}$ at optical wavelengths of 1.532 microns (1 micron=$10^{-6}$ meters), an inhomogeneous bandwidth of 200 GHz, and an ion density of $5 \times 10^{13}$ ions per Hz per cubic meter. The homogeneous linewidth was taken to be 40 kiloHertz (kHz, 1 kHZ=1000 cycles per second). The length of the material (6 mm) was chosen to give an absorption length ($\alpha_0 L$) of 1.8. The maximum laser power was set to 1 Watt, consistent with the performance of optical amplifiers near 1.5 microns. The diameter of the laser spot (250 microns) was chosen to keep the maximum excitation below 10% to avoid coherent saturation. The filter functions used for processing the digitized readout signals were the Fourier transforms of the reference waveforms.

Figure 7A:
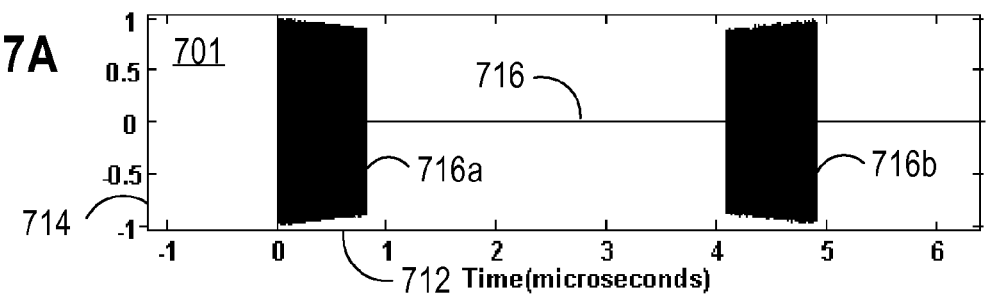
FIG. 7A is a graph that illustrates an example target signal and example reference signal, according to an embodiment.

FIG. 7A is a graph 701 that illustrates an example target signal and example reference signal, according to an embodiment. The horizontal axis 712 represents time in microseconds. The vertical axis 714 represents amplitude of an electric field in arbitrary units. The vertical scale is normalized so that +/−1.0 corresponds to the peak laser power of 1.0 Watt. The signal 716 includes the example target signal 716a and the reference signal 716b after a delay τ of 4 microseconds. The signals are introduced with exponential ramps to compensate for homogeneous decay.

Figure 7B:
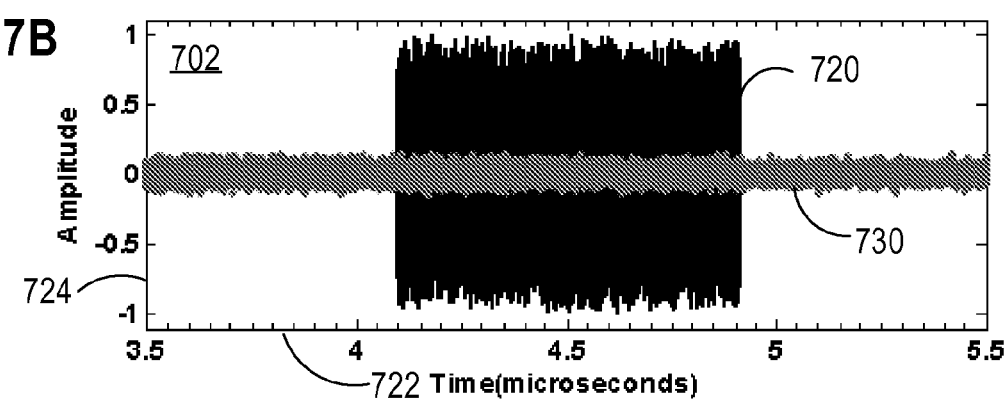
FIG. 7B is a graph that illustrates a target digital signal output and error, according to an embodiment.
Figure 7C:
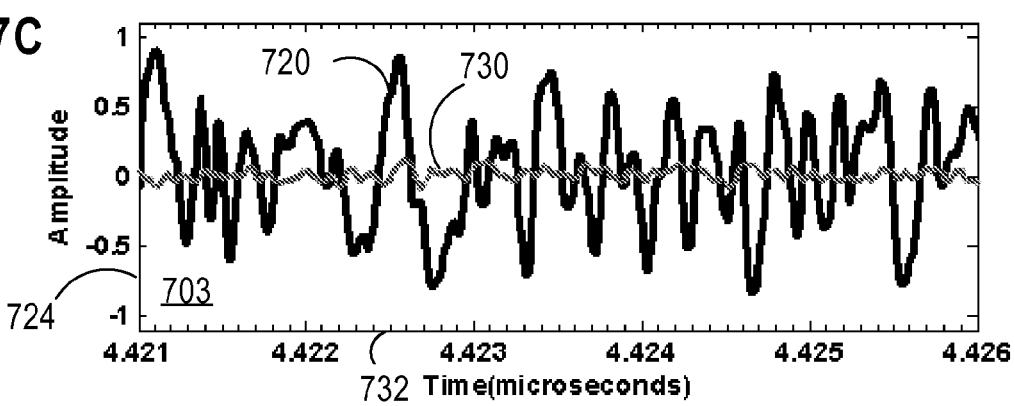
FIG. 7C is a graph 703 that illustrates a magnified portion of the graph of FIG. 7B.

FIG. 7B is a graph 702 that illustrates a target digital signal output and error, according to an embodiment. The horizontal axis 722 represents time in microseconds. The vertical axis 724 represents amplitude of an electric field in arbitrary units. The captured waveform 720 is shown as solid black points and a magnified (by a factor of 100) error signal 730 is shown as gray dots. The error signal is the difference between the captured waveform 720 and the simulated target analog signal 716a filtered by the linear device response function described above. FIG. 7C is a graph 703 that illustrates a magnified portion of the graph 702 of FIG. 7B. The horizontal axis 732 represents time in microseconds. The vertical axis 724 represents amplitude of an electric field in arbitrary units.

Three metrics are used to characterize the dynamic range performance of the illustrated SSH ADC embodiment. The first is the common metric used for sinusoidal waveforms, which is based on the signal to noise ratio, SNR (the ratio of the mean square of the signal to the mean square of the error signal). The effective number of bits (ENOB) is given by $(10*\log_{10}(SNR)-1.76)/6.02$, which yielded 9.8 bits for the above example. The second metric is equivalent to the first definition for a sine wave, but is a more appropriate metric for analog signals. The effective number of bits is computed as $\log_2(1/(2\sqrt{3}))$ times the ratio of the peak to peak signal amplitude to the root mean square of the error signal. For the analog signal above, the SSH ADC demonstrated 10.3-bit performance. To verify this metric, a third metric was computed that compared the performance of the SSH ADC to an idealized ADC. The filtered target signal was quantized with $2^N$ levels to find the root mean square (rms) error as a function of N. The equivalent bit performance of the SSH ADC is then extrapolated from this function to be 10.3 bits, in good agreement with the second metric Analysis of the 10 GHz bandwidth SSH ADC ($2 \times 10^{10}$ samples, per second, SPS) predicts the device can achieve 10-bit performance with currently available components and that SSH ADC devices are scalable to bandwidths up to 100 GHz ($2 \times 10^{11}$ SPS).

Figure 8:
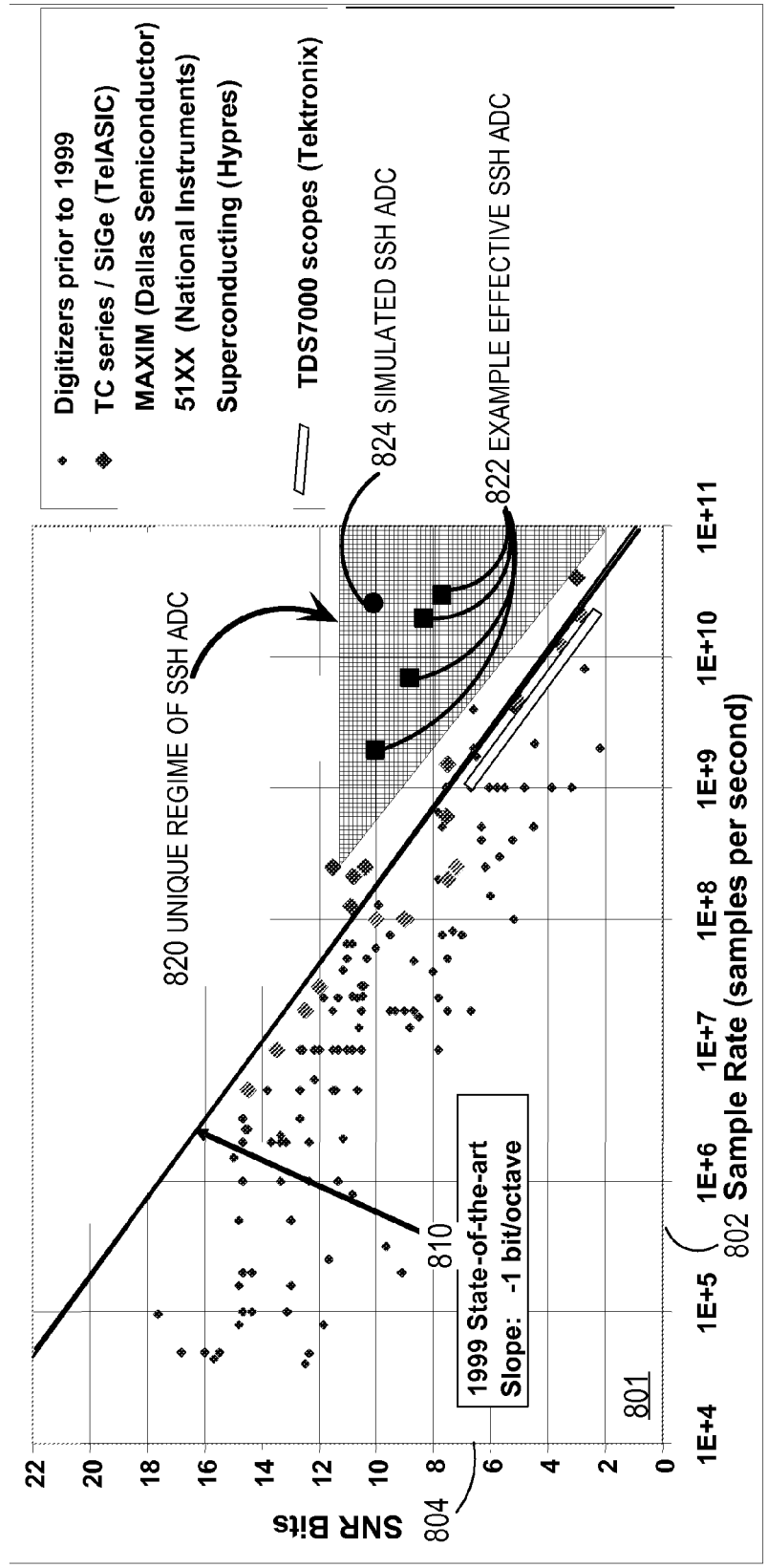
FIG. 8 is a graph that illustrates the performance of current approaches compared to expected performance of ADCs according to several embodiments.

FIG. 8 is a graph 801 that illustrates the performance of current approaches compared to expected performance of SSH ADCs according to several embodiments. The horizontal axis 802 is sample rate in samples per second (SPS). The vertical axis 804 is signal to noise ratio (SNR) Bits. The small diamonds indicate the performance of ADCs prior to 1999 as published in R. H. Walden, "Analog-to-digital converter survey and analysis,"*IEEE-Journal-on-Selected-Areas-in-Com-*

*munications*, vol. 17, no. 4, pp 539-50, 1999 (hereinafter, Walden). The line 810 with slope −1 bit per octave (doubling of sample rate) represents the limit of state-of-the-art ADCs in 1999 as described in Walden.

The large diamonds indicate the performance of more recent ADCs, including the TC/SERIES/SIGE™ manufactured by TELASIC™ of El Segundo, Calif., MAXIM™ of Sunnyvale, Calif., 51XX™ line manufactured by NATIONAL INSTRUMENTS™ of Austin, Tex., and SUPERCONDUCTING ADCs manufactured by HYPRES™ of Elmsford, N.Y. Also plotted on graph 801 is a rectangular band that represents the performance of TDS7000™ scopes from TEKTRONIX™ of Beaverton, Oreg. Even the more modern ADCs do not perform much above the line 810.

The SSH ADCs of the illustrated embodiment have better performance than the prior approaches and occupy a unique regime 820 of graph 801 that is not occupied by the prior approaches. The simulated performance described above for an example SSH ADC is plotted as a solid circle 824, deep in the unique regime 820 of SSH ADCs. The processor described in Merkel using SSH and commercial ADCs detected delays in high bandwidth signals that are equivalent to sampling the original emitted and reflected waveforms with sample rates from over $10^9$ to over $2 \times 10^{10}$ with SNR bits from 10 to 8 on readout. This performance is plotted as solid squares 822 of performance for effective SSH ADCs. Graph 801 clearly shows a superior performance regime 820 that is currently occupied uniquely by SSH ADCs.

An interesting attribute of the SSH ADC is that there is no aliasing of frequencies that are above a cut-off frequency (the Nyquist frequency), as there is in typical ADCs. Frequency components above the 3 dB bandwidth are still captured by the SSH ADC, though attenuated, and do not distort the lower frequency performance. This makes the SSH ADC an ideal device to use for direct digital conversion of signals modulated on high frequency carriers when there are spurious signals in nearby bands. Direct digital conversion can be accomplished without down-mixing the target analog signal. Instead, the reference waveform is up-converted to the frequency band of interest. The reference signal need not be centered on the carrier frequency of the target signal in order to faithfully capture it, which makes the SSH ADC also ideal for capturing frequency hopping signals and other signals of unknown central frequencies.

Figure 9:
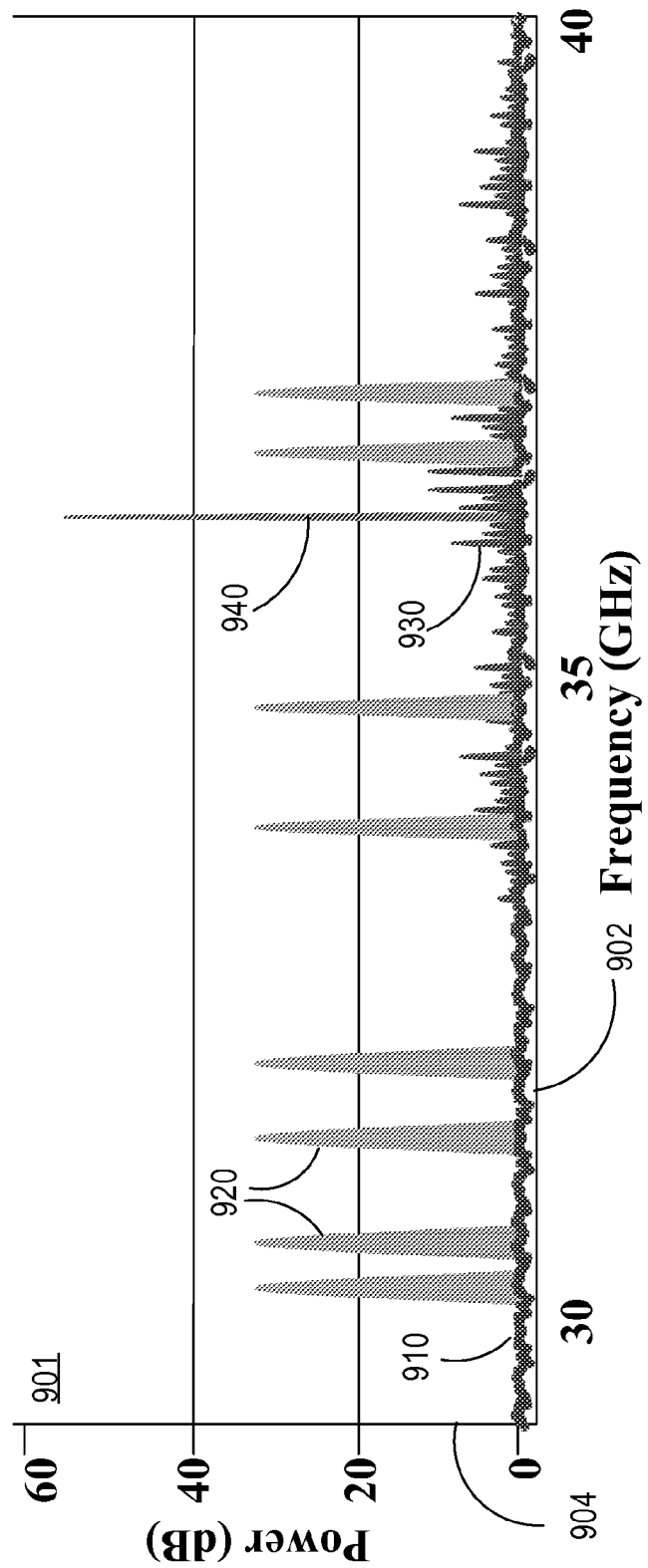
FIG. 9 is a graph that illustrates a possible signal set of interest (SSOI) to be digitized, according to an embodiment.

Reconnaissance operations benefit from the collection and digitization of broadband and diverse signals throughout the microwave spectrum, including signals with frequency hopping carriers and complex modulation formats, along with strong narrow band signals. FIG. 9 is a graph 901 that illustrates a possible signal set of interest (SSOI) to be digitized, according to an embodiment. The horizontal axis 902 represents microwave frequency in GHz. The vertical axis 904 represents microwave power spectral density in decibels per Hertz (dB/Hz). The SSOI includes background noise 910, a frequency hopping communication signal 920, a wide spectrum signal 930 used for multiple communications, and a strong narrow-band signal 940, such as used in radar fire control systems and jamming devices. Interception of all the diverse signals in the 10 GHz wide SSOI requires broadband digitization with 10 GHz bandwidth. The SSH ADC of the illustrated embodiment can achieve direct digital conversion (DDC) of a broadband (up to 20 GHz wide) SSOI anywhere in the microwave spectrum (up to 100 GHz) without down-conversion, such as in the band near 35 GHz depicted in FIG. 9. Furthermore, the ability to digitize and process broadband SSOI provides the ability to capture or null non-cooperative communications, radar transmissions, and jammers, allowing for the capture of signals with unknown and varying carrier frequencies and modulation formats, such as frequency-hopping sources. The SSOI is modulated onto an optical carrier, along with a well-characterized reference waveform. The reference waveform can be created by a digital signal modulated onto a microwave carrier centered on the frequency band of interest. The reference microwave carrier's frequency need not match the carrier frequency of any of the signals in the SSOI.

An additional promising feature of the SSH ADC is the potential for parallel processing of thousands of ultra-wideband channels in a single crystal. Such parallelism facilitates the capture of continuous waveforms or the coherent monitoring of multiple signals, which can allow for complex beam-forming operations.

3. DIGITAL PROCESSOR OVERVIEW

Figure 10:
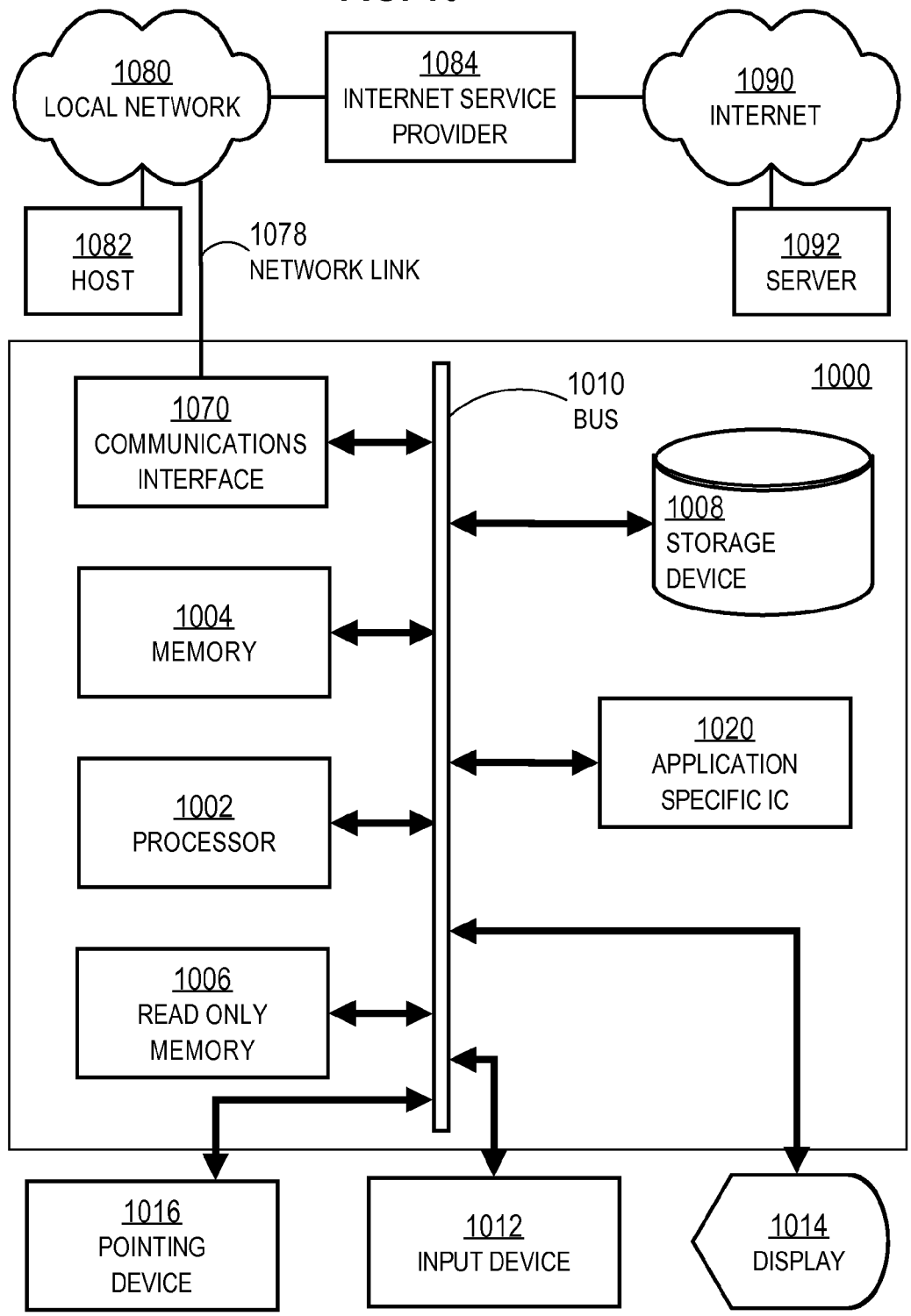
FIG. 10 is a block diagram that illustrates a computer system upon which an embodiment of the invention may be implemented.

FIG. 10 is a block diagram that illustrates a computer system 900 upon which an embodiment of the invention may be implemented. Computer system 900 includes a communication mechanism such as a bus 910 for passing information between other internal and external components of the computer system 900. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit). A sequence of binary digits constitutes digital data that is used to represent a number or code for a character. A bus 910 includes many parallel conductors of information so that information is transferred quickly among devices coupled to the bus 910. One or more processors 902 for processing information are coupled with the bus 910. A processor 902 performs a set of operations on information. The set of operations include bringing information in from the bus 910 and placing information on the bus 910. The set of operations also typically include comparing two or more units of information, shifting positions of units of information, and combining two or more units of information, such as by addition or multiplication. A sequence of operations to be executed by the processor 902 constitute computer instructions.

Computer system 900 also includes a memory 904 coupled to bus 910. The memory 904, such as a random access memory (RAM) or other dynamic storage device, stores information including computer instructions. Dynamic memory allows information stored therein to be changed by the computer system 900. RAM allows a unit of information stored at a location called a memory address to be stored and retrieved independently of information at neighboring addresses. The memory 904 is also used by the processor 902 to store temporary values during execution of computer instructions. The computer system 900 also includes a read only memory (ROM) 906 or other static storage device coupled to the bus 910 for storing static information, including instructions, that is not changed by the computer system 900. Also coupled to bus 910 is a non-volatile (persistent) storage device 908, such as a magnetic disk or optical disk, for storing information, including instructions, that persists even when the computer system 900 is turned off or otherwise loses power.

Information, including instructions, is provided to the bus 910 for use by the processor from an external input device 912, such as a keyboard containing alphanumeric keys operated by a human user, or a sensor. A sensor detects conditions in its vicinity and transforms those detections into signals compatible with the signals used to represent information in computer system 900. Other external devices coupled to bus 910, used primarily for interacting with humans, include a display device 914, such as a cathode ray tube (CRT) or a liquid crystal display (LCD), for presenting images, and a pointing device 916, such as a mouse or a trackball or cursor direction keys, for controlling a position of a small cursor image presented on the display 914 and issuing commands associated with graphical elements presented on the display 914.

In the illustrated embodiment, special purpose hardware, such as an application specific integrated circuit (IC) 920, is coupled to bus 910. The special purpose hardware is configured to perform operations not performed by processor 902 quickly enough for special purposes. Examples of application specific ICs include graphics accelerator cards for generating images for display 914, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 900 also includes one or more instances of a communications interface 970 coupled to bus 910. Communication interface 970 provides a two-way communication coupling to a variety of external devices that operate with their own processors, such as printers, scanners and external disks. In general the coupling is with a network link 978 that is connected to a local network 980 to which a variety of external devices with their own processors are connected. For example, communication interface 970 may be a parallel port or a serial port or a universal serial bus (USB) port on a personal computer. In some embodiments, communications interface 970 is an integrated services digital network (ISDN) card or a digital subscriber line (DSL) card or a telephone modem that provides an information communication connection to a corresponding type of telephone line. In some embodiments, a communication interface 970 is a cable modem that converts signals on bus 910 into signals for a communication connection over a coaxial cable or into optical signals for a communication connection over a fiber optic cable. As another example, communications interface 970 may be a local area network (LAN) card to provide a data communication connection to a compatible LAN, such as Ethernet. Wireless links may also be implemented. For wireless links, the communications interface 970 sends and receives electrical, acoustic or electromagnetic signals, including infrared and optical signals, that carry information streams, such as digital data. Such signals are examples of carrier waves.

The term computer-readable medium is used herein to refer to any medium that participates in providing information to processor 902, including instructions for execution.

Such a medium may take many forms, including, but not limited to, non-volatile media, volatile media and transmission media. Non-volatile media include, for example, optical or magnetic disks, such as storage device 908. Volatile media include, for example, dynamic memory 904. Transmission media include, for example, coaxial cables, copper wire, fiber optic cables, and waves that travel through space without wires or cables, such as acoustic waves and electromagnetic waves, including radio, optical and infrared waves. Signals that are transmitted over transmission media are herein called carrier waves.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read.

Network link 978 typically provides information communication through one or more networks to other devices that use or process the information. For example, network link 978 may provide a connection through local network 980 to a host computer 982 or to equipment 984 operated by an Internet Service Provider (ISP). ISP equipment 984 in turn provides data communication services through the public, world-wide packet-switching communication network of networks now commonly referred to as the Internet 990. A computer called a server 992 connected to the Internet provides a service in response to information received over the Internet. For example, server 992 provides information representing video data for presentation at display 914.

The invention is related to the use of computer system 900 for implementing the techniques described herein. According to one embodiment of the invention, those techniques are performed by computer system 900 in response to processor 902 executing one or more sequences of one or more instructions contained in memory 904. Such instructions, also called software and program code, may be read into memory 904 from another computer-readable medium such as storage device 908. Execution of the sequences of instructions contained in memory 904 causes processor 902 to perform the method steps described herein. In alternative embodiments, hardware, such as application specific integrated circuit 920, may be used in place of or in combination with software to implement the invention. Thus, embodiments of the invention are not limited to any specific combination of hardware and software. Logic encoded in one or more tangible media encompasses both instructions and special purpose hardware.

The signals transmitted over network link 978 and other networks through communications interface 970, which carry information to and from computer system 900, are exemplary forms of carrier waves. Computer system 900 can send and receive information, including program code, through the networks 980, 990 among others, through network link 978 and communications interface 970. In an example using the Internet 990, a server 992 transmits program code for a particular application, requested by a message sent from computer 900, through Internet 990, ISP equipment 984, local network 980 and communications interface 970. The received code may be executed by processor 902 as it is received, or may be stored in storage device 908 or other non-volatile storage for later execution, or both. In this manner, computer system 900 may obtain application program code in the form of a carrier wave.

Various forms of computer readable media may be involved in carrying one or more sequence of instructions or data or both to processor 902 for execution. For example, instructions and data may initially be carried on a magnetic disk of a remote computer such as host 982. The remote computer loads the instructions and data into its dynamic memory and sends the instructions and data over a telephone line using a modem. A modem local to the computer system 900 receives the instructions and data on a telephone line and uses an infra-red transmitter to convert the instructions and data to an infra-red signal, a carrier wave serving as the network link 978. An infrared detector serving as communications interface 970 receives the instructions and data carried in the infrared signal and places information representing the instructions and data onto bus 910. Bus 910 carries the information to memory 904 from which processor 902 retrieves and executes the instructions using some of the data sent with the instructions. The instructions and data received in memory 904 may optionally be stored on storage device 908, either before or after execution by the processor 902.

4. EXTENSIONS AND ALTERNATIVES

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for converting an analog waveform to a series of digital values comprising:
   receiving an input analog waveform to be digitized over a particular frequency band;
   recording a phase-sensitive frequency-domain representation of the input analog waveform without using a spectral-spatial holographic (SSH) material with inhomogeneously broadened transition (IBT) absorption properties;
   digitizing a readout of the phase-sensitive frequency-domain representation to produce a spectral series of digital values; and
   determining, based on the spectral series, an output series of digital values that represent the analog waveform digitized over the particular frequency band.

2. A method recited in claim 1, said step of digitizing the readout of the phase-sensitive frequency-domain representation to produce a spectral series of digital values further comprising digitizing the readout of the phase-sensitive frequency-domain representation with a high dynamic range, low bandwidth digitizer to produce the spectral series of digital values, wherein the low bandwidth digitizer has a bandwidth at least a factor of two less than a width of the particular frequency band.

3. A method as recited in claim 1, wherein the input analog waveform is centered on a microwave radio frequency in the range from about 1 to about 1000 GigaHertz (1 GigaHertz=$10^9$ cycles per second) and a width of the particular frequency band is in a range from about 1 to about 100 GigaHertz.

4. A method for converting an analog waveform to a series of digital values comprising:
   receiving an input analog waveform to be digitized over a particular frequency band;
   recording a phase-sensitive frequency-domain representation of the input analog waveform, including
      receiving a reference analog waveform having a well known Fourier transform represented by a reference spectrum series of digital values, and
      causing a first optical waveform based on the input analog waveform and a second optical waveform based on the reference analog waveform to interfere and create a combined spectrum with interference terms;
   digitizing a readout of the phase-sensitive frequency-domain representation to produce a spectral series of digital values; and
   determining, based on the spectral series, an output series of digital values that represent the analog waveform digitized over the particular frequency band.

5. A method as recited in claim 4, said step of digitizing a readout of the phase-sensitive frequency-domain representation to produce a spectral series of digital values further comprising:
   directing a combined optical waveform with the combined spectrum onto a grating that disperses the combined waveform into a plurality of spatially separated waveforms corresponding to a plurality of frequencies in the combined spectrum; and
   detecting the plurality of spatially separated waveforms at a plurality of spatially separated detectors that produce a corresponding plurality of detected values; and
   generating the spectral series of digital values based on the plurality of detected values.

6. A method as recited in claim 4, said step of causing the first optical waveform and the second optical waveform to interfere further comprising causing the first optical waveform based on the input analog waveform and the second optical waveform based on the reference analog waveform to interact in a spectral-spatial holographic (SSH) material with inhomogeneously broadened transition (IBT) absorption properties to form a modulated spectral absorption grating in the SSH material.

7. A method as recited in claim 6, said step of digitizing the phase-sensitive frequency-domain representation further comprising:
   directing a chirped optical waveform on the SSH material to generate a readout waveform;
   digitizing the readout waveform with a high dynamic range, low bandwidth detector and digitizer combination to produce a readout series of digital readout values wherein the detector and digitizer combination has a bandwidth at least a factor of two less than a width of the particular frequency band; and
   determining the spectral series based on the readout series.

8. A method as recited in claim 4, said step of determining an output series of digital values that represent the analog waveform based on the spectral series further comprising:
   multiplying the spectral series by a filter function series that represents a filter function that corresponds to the reference analog waveform to produce a product series of digital values, and
   determining an inverse Fourier transform of the product series to produce the output series of digital values that represent the analog waveform,
   wherein a product of the filter function series and the reference spectrum series produces a broadband digital function with substantively constant amplitude over the particular frequency band.

9. A method as recited in claim 8, wherein the filter function is the same as a complex conjugate of the reference spectrum series.

10. A method as recited in claim 8, wherein the filter function series represents an inverse filter function.

11. A method as recited in claim 8, wherein the filter function series represents a Weiner filter.

12. A method as recited in claim 4, said step of determining an output series of digital values that represent the analog waveform based on the spectral series further comprising:
   multiplying the spectral series by a filter function series that represents a filter function that corresponds to the reference analog waveform to produce a product series of digital values, and determining an inverse Fourier transform of the product series to produce the output series of digital values that represent the analog waveform, wherein a product of the filter function series and a series that represents a complex conjugate of the reference spectrum series produces a broadband digital function with substantively constant amplitude over the particular frequency band.

13. A method as recited in claim 12, wherein the filter function series is the same as the reference spectrum series.

14. A method as recited in claim 4, said step of recording the phase-sensitive frequency-domain representation of the input analog waveform further comprising modulating an optical carrier waveform with the input analog waveform to produce the first optical waveform.

15. A method as recited in claim 4, said step of recording a phase-sensitive frequency-domain representation of the input analog waveform further comprising:

receiving a second reference analog waveform having a well known second Fourier transform represented by a second reference spectrum series of digital values, wherein the second reference analog waveform forms a complementary pair with the reference analog waveform such that a sum of a power spectrum of the reference analog waveform with a power spectrum of the second reference analog waveform is substantively constant over the particular frequency band; and causing the first optical waveform based on the input analog waveform and a third optical waveform based on the second reference analog waveform to interfere and create a second combined spectrum with interference terms in a different spatial mode.

16. A method as recited in claim 15, said step of digitizing a readout of the phase-sensitive frequency-domain representation to produce a spectral series of digital values further comprising digitizing a second readout of the second combined spectrum in the different spatial mode to produce a second spectral series of digital values.

17. A method as recited in claim 16, said step of determining an output series of digital values that represent the analog waveform based on the spectral series further comprising:

multiplying the spectral series by the reference spectrum series to produce a first product series of digital values, multiplying the second spectral series by the second reference spectrum series to produce a second product series of digital values;

adding the first product series to the second product series to produce a summation series; and determining an inverse Fourier transform of the summation series to produce the output series of digital values that represent the analog waveform.

18. A method as recited in claim 16, said step of determining an output series of digital values that represent the analog waveform based on the spectral series further comprising:

multiplying the spectral series by the reference spectrum series to produce a first product series of digital values, multiplying the second spectral series by the second reference spectrum series to produce a second product series of digital values;

determining a first inverse Fourier transform of the first product series to produce a first transformed series;

determining a second inverse Fourier transform of the second product series to produce a second transformed series; and adding the first transformed series to the second transformed series to produce the output series of digital values that represent the analog waveform.

19. A method as recited in claim 4, said step of digitizing the readout of the phase-sensitive frequency-domain representation to produce a spectral series of digital values further comprising digitizing the readout of the phase-sensitive frequency-domain representation with a high dynamic range, low bandwidth digitizer to produce the spectral series of digital values, wherein the low bandwidth digitizer has a bandwidth at least a factor of two less than a width of the particular frequency band.

20. A method as recited in claim 4, wherein the input analog waveform is centered on a microwave radio frequency in the range from about 1 to about 1000 GigaHertz (1 GigaHertz=$10^9$ cycles per second) and a width of the particular frequency band is in a range from about 1 to about 100 GigaHertz.

21. An apparatus for converting an analog waveform to a series of digital values comprising:

means for receiving an input analog waveform to be digitized over a particular frequency band;

means for recording a phase-sensitive frequency-domain representation of the input analog waveform without using a spectral-spatial holographic (SSH) material with inhomogeneously broadened transition (IBT) absorption properties;

means for digitizing the phase-sensitive frequency-domain representation to produce a spectral series of digital values; and means for determining an output series of digital values that represent the analog waveform based on the spectral series.

22. An apparatus for converting an analog waveform to a series of digital values comprising:

a signal input for receiving an input analog waveform to be digitized in time over a particular frequency band;

a spectral-spatial holographic (SSH) material with inhomogeneously broadened transition (IBT) absorption properties for recording a phase-sensitive frequency-domain representation of the input analog waveform within a modulated spectral absorption grating in the SSH material;

a source of a chirped optical waveform directed onto the SSH material to generate a readout waveform based on the frequency domain representation of the input analog waveform;

a high dynamic range, low bandwidth digitizer for digitizing the readout waveform to produce a readout series of digital values, wherein the low bandwidth digitizer has a bandwidth at least a factor of two less than a width of the particular frequency band; and a processor comprising logic encoded in one or more tangible media for execution and, when executed, operable for performing the step of determining, based on the readout series, an output time series of digital values that represent the analog waveform.

23. An apparatus for converting an analog waveform to a series of digital values comprising a signal input for receiving an input analog waveform to be digitized over a particular frequency band;

a spectral-spatial holographic (SSH) material with inhomogeneously broadened transition (IBT) absorption properties for recording a phase-sensitive frequency-domain representation of the input analog waveform within a modulated spectral absorption grating in the SSH material;

a source of a chirped optical waveform directed onto the SSH material to generate a readout waveform based on the frequency domain representation of the input analog waveform;

a high dynamic range, low bandwidth digitizer for digitizing the readout waveform to produce a readout series of digital values, wherein the low bandwidth digitizer has a bandwidth at least a factor of two less than a width of the particular frequency band;

a processor comprising logic encoded in one or more tangible media for execution and, when executed, operable for performing the step of determining, based on the readout series, an output series of digital values that represent the analog waveform; and a second source of a reference analog waveform directed to interact with the input analog waveform in the SSH material, wherein the reference analog waveform has a well known Fourier transform, the reference analog waveform has a well known corresponding filter function; and a product of the filter function and the Fourier transform of the reference analog signal produces a broadband function with substantively constant amplitude over the particular frequency band.

24. An apparatus as recited in claim 23, said step of determining the output series of digital values further comprises performing the steps of:

determining, based on the output series, a spectral series that represents the phase-sensitive frequency-domain representation of the input analog waveform in the SSH material;

multiplying the spectral series by a filter function series that represents the filter function to produce a product series of digital values, and determining an inverse Fourier transform of the product series to produce the output series of digital values that represent the analog waveform.

25. An apparatus as recited in claim 24, wherein the filter function is the same as a complex conjugate of the Fourier transform of the reference analog signal.

26. An apparatus as recited in claim 23, further comprising a source of an optical carrier waveform and a modulator for modulating the optical carrier waveform with the input analog waveform to produce a modulated optical waveform directed onto the SSH material.

27. An apparatus as recited in claim 23, wherein the input analog waveform is centered on a microwave radio frequency in the range from about 1 to about 1000 GigaHertz (1 GigaHertz=$10^9$ cycles per second) and a width of the particular frequency band is in a range from about 1 to about 32100 GigaHertz.

28. An apparatus as recited in claim 23, further comprising:

a first optical coupler for directing the input analog waveform onto a first spatial mode in the SSH material where the input analog waveform interacts with the reference analog waveform and onto a different second spatial mode in the SSH material; and a third source of a second reference analog waveform directed to interact with the input analog waveform in the second spatial mode in the SSH material; and a second optical coupler for directing the chirped optical waveform onto the first spatial mode and the second spatial mode, wherein the second reference analog waveform has a well known second Fourier transform, and the second reference analog waveform forms a complementary pair with the reference analog waveform such that a sum of a power spectrum of the reference analog waveform with a power spectrum of the second reference analog waveform is substantively constant over the particular frequency band.

29. An apparatus as recited in claim 28, said step of determining an output series of digital values that represent the analog waveform based on the readout series further comprising:

determining, based on the readout series, a first spectral series representing a first interaction spectrum of the reference analog waveform with the input analog waveform;

determining, based on the readout series, a second spectral series representing a second interaction spectrum of the second reference analog waveform with the input analog waveform;

multiplying the first spectral series by a first reference spectrum series that represents the Fourier transform of the reference analog waveform to produce a first product series of digital values, multiplying the second spectral series by a second reference spectrum series that represents the second Fourier transform to produce a second product series of digital values;

adding the first product series to the second product series to produce a summation series; and determining an inverse Fourier transform of the summation series to produce the output series of digital values that represent the analog waveform.

30. An apparatus as recited in claim 28, said step of determining an output series of digital values that represent the analog waveform based on the readout series further comprising:

determining, based on the readout series, a first spectral series representing a first interaction spectrum of the reference analog waveform with the input analog waveform;

determining, based on the readout series, a second spectral series representing a second interaction spectrum of the second reference analog waveform with the input analog waveform;

multiplying the first spectral series by a first reference spectrum series that represents the Fourier transform of the reference analog waveform to produce a first product series of digital values, multiplying the second spectral series by a second reference spectrum series that represents the second Fourier transform to produce a second product series of digital values;

determining a first inverse Fourier transform of the first product series to produce a first transformed series;

determining a second inverse Fourier transform of the second product series to produce a second transformed series; and adding the first transformed series to the second transformed series to produce the output series of digital values that represent the analog waveform.

31. An apparatus for converting an analog waveform to a series of digital values comprising
   a signal input for receiving an input analog waveform to be digitized over a particular frequency band;
   a spectral-spatial holographic (SSH) material with inhomogeneously broadened transition (IBT) absorption properties for recording a phase-sensitive frequency-domain representation of the input analog waveform within a modulated spectral absorption grating in the SSH material;
   a source of a chirped optical waveform directed onto the SSH material to generate a readout waveform based on the frequency domain representation of the input analog waveform;
   a high dynamic range, low bandwidth digitizer for digitizing the readout waveform to produce a readout series of digital values, wherein the low bandwidth digitizer has a bandwidth at least a factor of two less than a width of the particular frequency band;
   a processor comprising logic encoded in one or more tangible media for execution and, when executed, operable for performing the step of determining, based on the readout series, an output series of digital values that represent the analog waveform; and
   a second source of a reference analog waveform directed to interact with the input analog waveform in the SSH material
   wherein
      the reference analog waveform has a well known Fourier transform,
      the reference analog waveform has a well known corresponding filter function, and
      a product of the filter function and a complex conjugate of the Fourier transform of the reference analog signal produces a broadband function with substantively constant amplitude over the particular frequency band.

32. An apparatus as recited in claim 31, said step of determining the output series of digital values further comprises performing the steps of:
   determining, based on the output series, a spectral series that represents the phase-sensitive frequency-domain representation of the input analog waveform in the SSH material;
   multiplying the spectral series by a filter function series that represents the filter function to produce a product series of digital values, and
   determining an inverse Fourier transform of the product series to produce the output series of digital values that represent the analog waveform.

33. An apparatus as recited in claim 32, wherein the filter function series is the same as the Fourier transform of the reference analog signal.

34. Logic encoded in one or more tangible media for execution to produce an output series of digital values that represent an analog waveform at a particular frequency band and, when executed, the logic is operable for performing the steps of:
   receiving a filter function series that represents a filter function that corresponds to a reference analog waveform that has a well known Fourier transform, wherein a product of the filter function and a particular function based on the well known Fourier transform produces a broadband function with substantively constant amplitude over the particular frequency band;
   receiving a spectral series that indicates a phase-sensitive frequency domain representation of an interaction of an input analog waveform with the reference waveform;
   multiplying the spectral series by a filter series that represents the filter function to produce a product series of digital values; and
   determining an inverse Fourier transform of a processed series that is based on the product series to produce an output series of digital values that represent the analog waveform.

35. Logic as recited in claim 34, wherein,
   the filter function is the same as the well known Fourier transform of the reference analog waveform; and
   the particular function is a complex conjugate of the well known Fourier transform of the reference analog waveform.

36. Logic as recited in claim 35, wherein, when executed, is further operable for performing the steps of:
   receiving a second filter function that corresponds to a second reference analog waveform that has a well known second Fourier transform, wherein the second reference analog waveform forms a complementary pair with the reference analog waveform such that a sum of a power spectrum of the reference analog waveform with a power spectrum of the second reference analog waveform is substantively constant over the particular frequency band;
   receiving a second spectral series that indicates a phase-sensitive frequency domain representation of a second interaction of the input analog waveform with the second reference waveform; and
   multiplying the second spectral series by the second filter function series to produce a second product series of digital values;
   wherein the processed series is also based on the second product series.

37. Logic as recited in claim 36, said step of determining an inverse Fourier transform of the processed series further comprising determining an inverse Fourier transform of a sum of the product series and the second product series.

38. Logic as recited in claim 34, wherein,
   the filter function is a complex conjugate of the well known Fourier transform of the reference analog waveform; and
   the particular function is the same as the well known Fourier transform of the reference analog waveform.

39. Logic as recited in claim 34, said step of determining an inverse Fourier transform of the processed series to produce the output series further comprising:
   determining an inverse Fourier transform of the product series to produce a first transformed series;
   determining an inverse Fourier transform of the second product series to produce a second transformed series; and
   adding the first transformed series and the second transformed series to produce the output series.

40. An apparatus for converting an analog waveform to a series of digital values comprising:

means for receiving an input analog waveform to be digitized over a particular frequency band;

means for recording a phase-sensitive frequency-domain representation of the input analog waveform, including means for receiving a reference analog waveform having a well known Fourier transform represented by a reference spectrum series of digital values, and means for interfering a first optical waveform based on the input analog waveform and a second optical waveform based on the reference analog waveform to create a combined spectrum with interference terms;

means for digitizing the phase-sensitive frequency-domain representation to produce a spectral series of digital values; and means for determining an output series of digital values that represent the analog waveform based on the spectral series.

* * * * *